United States Patent
Sakai

(10) Patent No.: US 9,446,588 B2
(45) Date of Patent: Sep. 20, 2016

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventor: Tomohiro Sakai, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/199,279

(22) Filed: Mar. 6, 2014

(65) Prior Publication Data

US 2014/0292948 A1 Oct. 2, 2014

(30) Foreign Application Priority Data

Mar. 26, 2013 (JP) .................................. 2013-065183

(51) Int. Cl.
| | | |
|---|---|---|
| B41J 1/14 | (2006.01) | |
| H01L 41/047 | (2006.01) | |
| B41J 2/14 | (2006.01) | |
| H01L 41/08 | (2006.01) | |
| H01L 41/09 | (2006.01) | |

(52) U.S. Cl.
CPC ......... *B41J 2/14201* (2013.01); *B41J 2/14233* (2013.01); *H01L 41/0815* (2013.01); *H01L 41/0973* (2013.01); *B41J 2202/03* (2013.01)

(58) Field of Classification Search
CPC .............. H03H 9/02559; H02N 2/163; B41J 2/14209; B41J 2/14233; B41J 2/1623
USPC ......... 347/70, 71, 72; 310/311, 323.06, 357, 310/363, 364, 360; 252/62.9 PZ
See application file for complete search history.

(56) References Cited

U.S. PATENT DOCUMENTS

| | | | |
|---|---|---|---|
| 2003/0020157 A1* | 1/2003 | Natori et al. ................. | 257/703 |
| 2007/0241642 A1 | 10/2007 | Miyazawa et al. | |
| 2010/0096952 A1* | 4/2010 | Fukuoka ....................... | 310/365 |
| 2010/0151179 A1* | 6/2010 | Nishihara et al. ........... | 428/64.5 |
| 2010/0264355 A1* | 10/2010 | Yamazaki et al. ..... | 252/62.9 PZ |
| 2010/0308692 A1* | 12/2010 | Kobayashi ........... | B41J 2/14233 310/339 |
| 2011/0006243 A1* | 1/2011 | Sasaki et al. .......... | 252/62.9 PZ |
| 2011/0292133 A1* | 12/2011 | Sasaki et al. ................... | 347/68 |
| 2011/0292134 A1* | 12/2011 | Sasaki et al. ................... | 347/68 |
| 2012/0268533 A1* | 10/2012 | Sakai et al. ..................... | 347/68 |
| 2013/0106960 A1* | 5/2013 | Wang ....................... | B41J 2/055 347/71 |
| 2013/0127293 A1* | 5/2013 | Ikeuchi et al. ................ | 310/311 |

FOREIGN PATENT DOCUMENTS

| | | |
|---|---|---|
| JP | 2001-223404 A | 8/2001 |
| JP | 2007-287745 A | 11/2007 |

OTHER PUBLICATIONS

Takeshi et al., Preparation of Bi4Ti3012 Thin Film on Si(100) Substrate Using Bi2SiO5 Buffer Layer and Its Electric Characterization, Jpn. J. Appl. Phys. vol. 32 (1998) pp. 5171-5173.*

* cited by examiner

*Primary Examiner* — Matthew Luu
*Assistant Examiner* — Patrick King
(74) *Attorney, Agent, or Firm* — Harness, Dickey & Pierce, P.L.C.

(57) ABSTRACT

A liquid ejecting head includes a piezoelectric element including a first electrode, a second electrode, and a piezoelectric layer between the first and the second electrodes. The piezoelectric layer includes a buffer layer disposed on the first electrode and containing Bi and an element selected from Al, Si, Cr, and Mn and a complex oxide layer disposed on the buffer layer and having a perovskite structure containing Bi, Fe, Ba, and Ti.

12 Claims, 18 Drawing Sheets

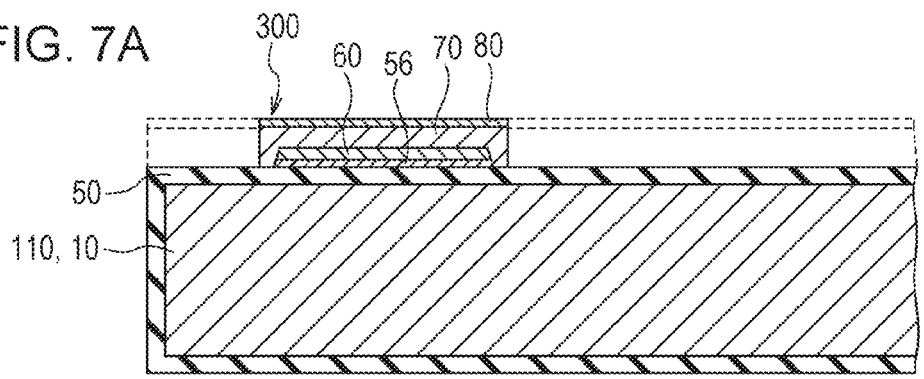
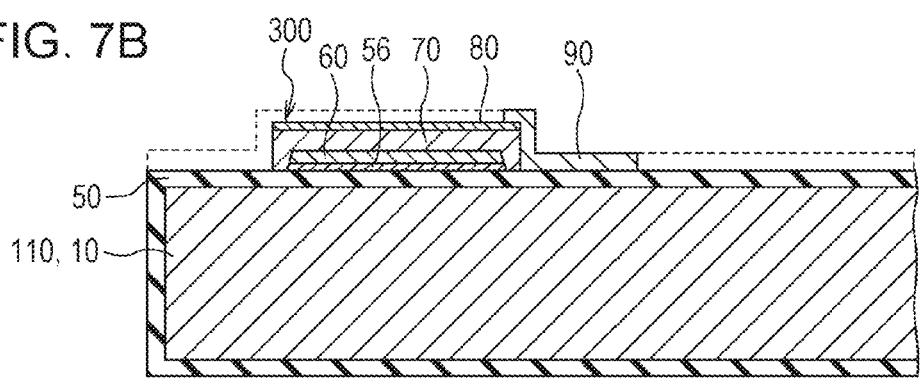
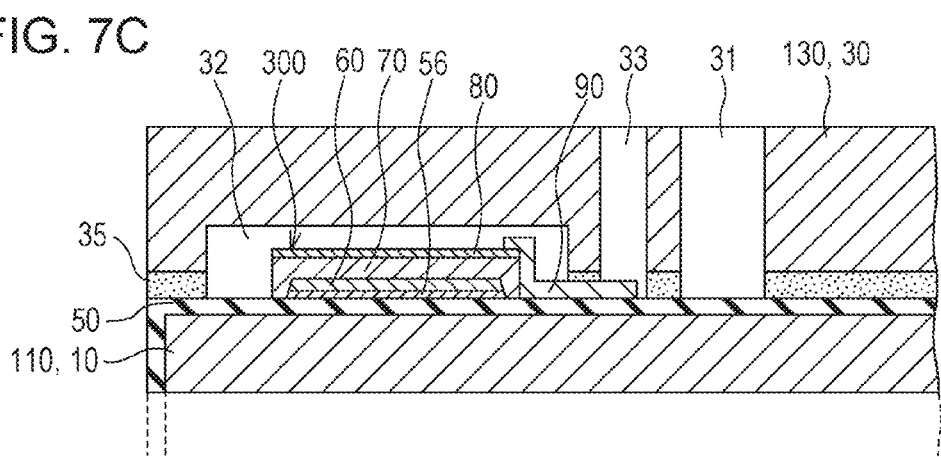

EXAMPLE 7

EXAMPLE 1

EXAMPLE 2

EXAMPLE 3

Pt
(111)  (110)

EXAMPLE 4

Pt
(111)  (110)

EXAMPLE 5

COMPARATIVE EXAMPLE 11

EXAMPLE 7

COMPARATIVE EXAMPLE 11

———— 150 μm

EXAMPLE 1

500 nm

EXAMPLE 7

500 nm

LIQUID EJECTING HEAD, LIQUID EJECTING APPARATUS, AND PIEZOELECTRIC ELEMENT

BACKGROUND

1. Technical Field

The present invention relates to a liquid ejecting head that includes a piezoelectric element including a piezoelectric layer made of a piezoelectric material and electrodes and discharges liquid droplets from a nozzle orifice, and relates to a liquid ejecting apparatus and a piezoelectric element.

2. Related Art

A typical liquid ejecting head is, for example, an ink jet recording head that has a diaphragm configuring a part of a pressure-generating chamber that communicates with a nozzle for discharging ink droplets and applying a pressure to the ink in the pressure-generating chamber by being deformed by a piezoelectric element to discharge the ink as droplets from the nozzle. Some of piezoelectric elements that are mounted on ink jet recording heads have a configuration in which a piezoelectric layer having an electromechanical conversion function, e.g., a piezoelectric layer (piezoelectric film) made of a crystallized dielectric material, is disposed between two electrodes.

The piezoelectric material used for the piezoelectric layer configuring such a piezoelectric element is required to have high piezoelectric properties, and typical examples of such piezoelectric material include lead zirconate titanate (PZT) (see JP-A-2001-223404). However, from the viewpoint of environmental issues, there is a demand for a lead-free or reduced-lead piezoelectric material.

Examples of the lead-free piezoelectric material include $BiFeO_3$-based piezoelectric materials containing Bi and Fe (for example, JP-A-2007-287745).

Unfortunately, the piezoelectric layers made of the $BiFeO_3$-based piezoelectric materials have a problem that cracks are apt to occur during the production process and after a certain time from the production. The occurrence of cracks leads to a reduction in piezoelectric properties, such as a reduction in displacement magnitude. Such a problem occurs not only in actuator apparatuses mounted on liquid ejecting heads such as ink jet recording heads but also in actuator apparatuses mounted on other apparatuses.

SUMMARY

An advantage of some aspects of the invention is to provide a liquid ejecting head, a liquid ejecting apparatus, and a piezoelectric element including a piezoelectric layer inhibited from cracking and having excellent crystallinity and piezoelectric properties.

An embodiment of the invention is a liquid ejecting head for discharging a liquid from a nozzle orifice. The liquid ejecting head comprises a piezoelectric element including a first electrode, a second electrode, and a piezoelectric layer between the first and the second electrodes. The piezoelectric layer comprises a buffer layer disposed on the first electrode and containing bismuth (Bi) and an element selected from aluminum (Al), silicon (Si), chromium (Cr), and manganese (Mn) and a complex oxide layer disposed on the buffer layer and having a perovskite structure containing bismuth (Bi), iron (Fe), barium (Ba), and titanium (Ti).

This embodiment can provide a liquid ejecting head including a piezoelectric layer inhibited from cracking and having excellent crystallinity and piezoelectric properties by that the piezoelectric layer has a laminated structure composed of a buffer layer containing Bi and an element selected from Al, Si, Cr, and Mn and a complex oxide layer.

It is preferable that the buffer layer contain Bi and Al and that the crystals in the piezoelectric layer be preferentially oriented along a (111) plane. In such an embodiment, a piezoelectric layer of crystals having a perovskite-structure and preferentially oriented along a (111) plane can be easily produced.

It is preferable that the buffer layer contain Bi and Si and that the crystals in the piezoelectric layer be preferentially oriented along a (110) plane. In such an embodiment, a piezoelectric layer of crystals having a perovskite structure and preferentially oriented along a (110) plane can be easily produced, and the piezoelectric layer can be provided with improved crystallinity.

It is preferable that the buffer layer contain Bi and Mn and that the crystals in the piezoelectric layer be preferentially oriented along a (100) plane. In such an embodiment, a piezoelectric layer of crystals having a perovskite structure and preferentially oriented along a (100) plane can be easily produced, and the piezoelectric layer can be provided with improved crystallinity.

It is preferable that the buffer layer contain Bi and Cr and that the crystals in the piezoelectric layer be strongly oriented along an appropriate direction. In such an embodiment, a piezoelectric layer of crystals having a perovskite structure and preferentially oriented along an appropriate direction can be easily produced, and the piezoelectric layer can be provided with improved crystallinity.

The buffer layers in the embodiments described above each preferably have a thickness of 10 nm or less. Since the buffer layer has a small thickness of 10 nm or less, the applied voltage is prevented from concentrating in the buffer layer having a low dielectric constant, and thereby the influence by a reduction in the voltage to be applied to the piezoelectric layer is decreased. Consequently, a voltage can be efficiently applied to the piezoelectric layer to improve the piezoelectric properties.

The buffer layers in the embodiments described above are each preferably disposed in an island form. Such a buffer layer can further inhibit reduction of the voltage to be applied to the piezoelectric layer. Consequently, a voltage can be further efficiently applied to the piezoelectric layer to further improve the piezoelectric properties.

The complex oxide layer preferably further contains Mn. In such an embodiment, the leakage characteristics of the piezoelectric layer are further improved.

Another embodiment of the present invention relates to a liquid ejecting apparatus including a liquid ejecting head according to any one of embodiments described above.

This embodiment can provide a liquid ejecting apparatus comprising a liquid ejecting head including a piezoelectric layer inhibited from cracking and having excellent crystallinity and piezoelectric properties.

Another embodiment of the present invention relates to a piezoelectric element comprising a first electrode, a second electrode and a piezoelectric layer between the first and the second electrodes. The piezoelectric layer comprises a buffer layer disposed on the first electrode and containing Bi and an element selected from Al, Si, Cr, and Mn and a complex oxide layer disposed on the buffer layer and having a perovskite structure containing Bi, Fe, Ba, and Ti.

This embodiment can provide a piezoelectric element comprising a piezoelectric layer inhibited from cracking and having excellent crystallinity and piezoelectric properties by that the piezoelectric layer has a laminated structure composed of a buffer layer containing Bi and an element selected from Al, Si, Cr, and Mn and a complex oxide layer.

BRIEF DESCRIPTION OF THE DRAWINGS

The invention will be described with reference to the accompanying drawings, wherein like numbers reference like elements.

FIGS. 7A to 7C are cross-sectional views illustrating a step of producing the recording head according to Embodiment 1.

DESCRIPTION OF EXEMPLARY EMBODIMENTS

Embodiment 1

Figure 1:
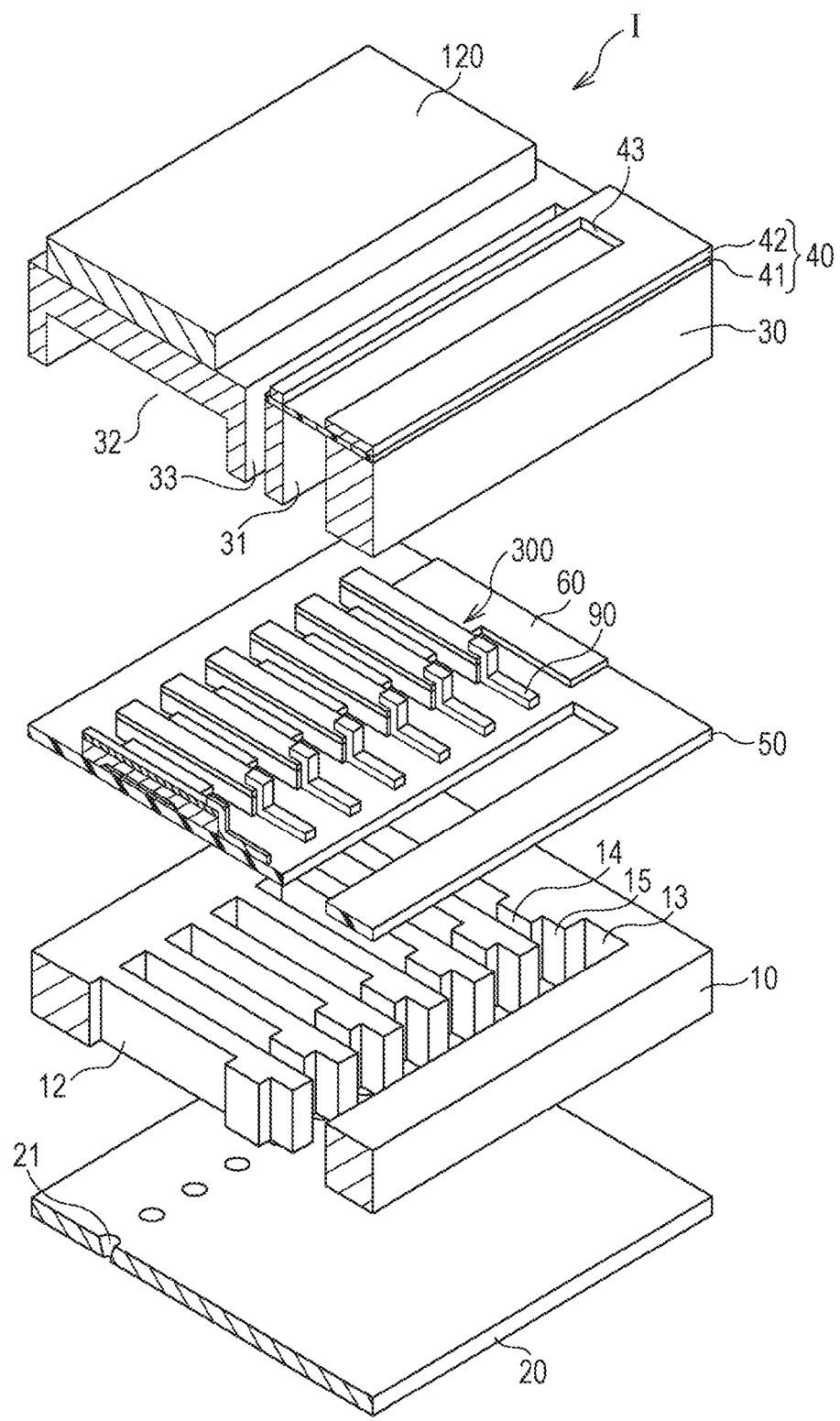
FIG. 1 is an exploded perspective view schematically illustrating the structure of a recording head according to Embodiment 1 of the invention.
Figure 2:
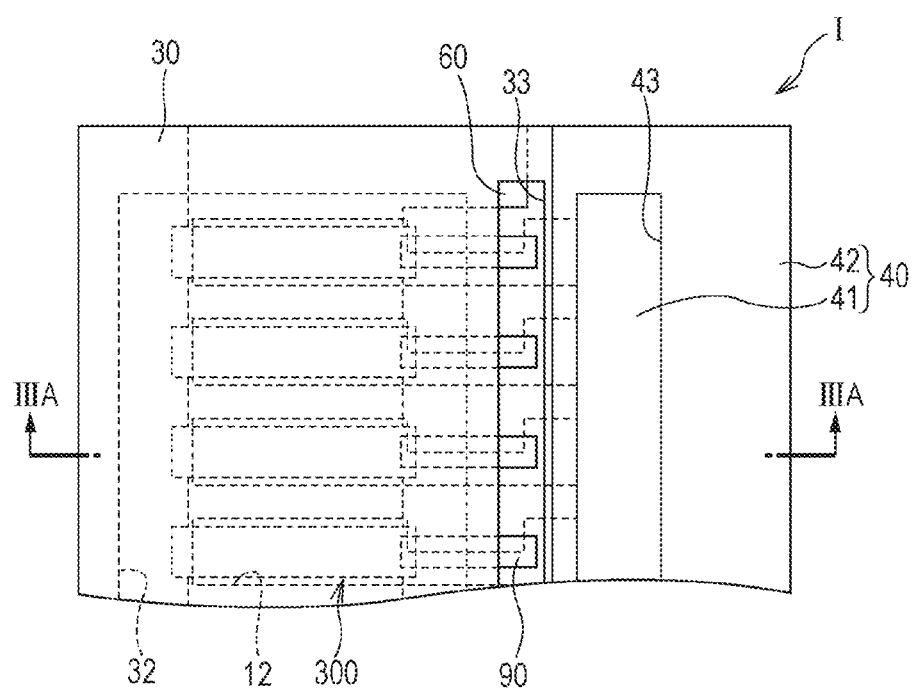
FIG. 2 is a plan view of the recording head according to Embodiment 1.
Figure 3A:
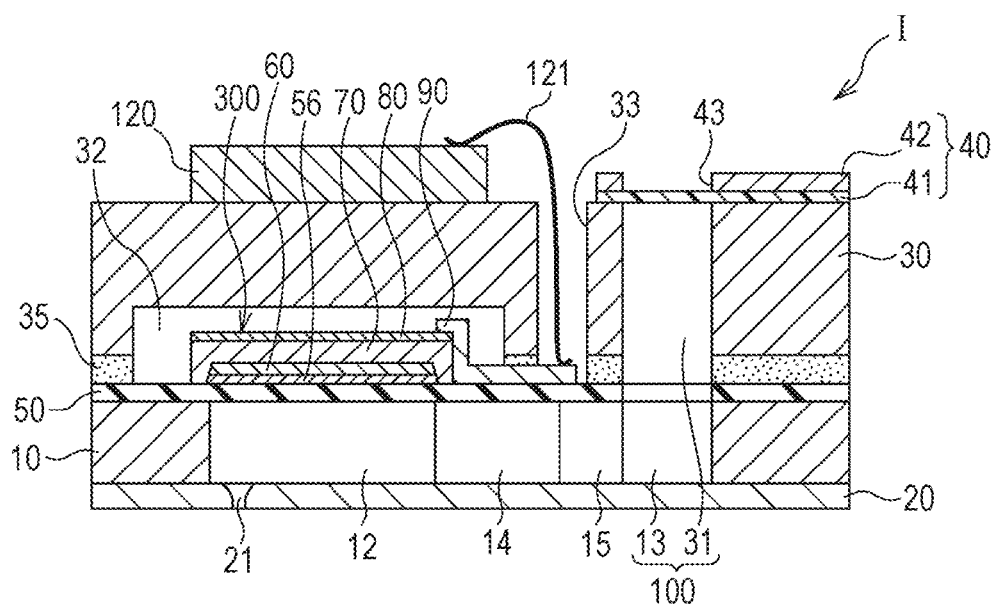
FIG. 3A is a cross-sectional view of the recording head according to Embodiment 1.
Figure 3B:
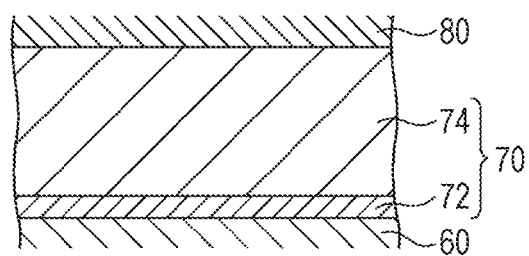
FIG. 3B is an enlarged cross-sectional view of a main portion of the recording head according to Embodiment 1.

FIG. 1 is an exploded perspective view illustrating a schematic structure of an ink jet recording head as an example of a liquid ejecting head produced by a method according to Embodiment 1 of the invention. FIG. 2 is a plan view of the ink jet recording head of FIG. 1. FIG. 3A is a cross-sectional view of the ink jet recording head shown in FIG. 2, taken along the line IIIA-IIIA. FIG. 3B is an enlarged cross-sectional view of a main portion of the ink jet recording head of FIG. 3A. As shown in FIGS. 1, 2, 3A, and 3B, the passage-forming substrate 10 is a single-crystal silicon substrate, and an elastic film 50 of silicon dioxide is formed on one surface of the substrate.

The passage-forming substrate 10 is provided with a plurality of pressure-generating chambers 12 arranged in parallel in their width direction. The passage-forming substrate 10 is further provided with a communicating portion 13 in a region on an outer side in the longitudinal direction of the pressure-generating chambers 12, and the communicating portion 13 and each pressure-generating chamber 12 are communicated with each other through an ink-supplying path 14 and a communicating path 15 provided to each of the pressure-generating chambers 12. The communicating portion 13 communicates with a manifold portion 31 of a protective substrate described below to constitute a part of the manifold serving as an ink chamber common to all the pressure-generating chambers 12. The ink-supplying path 14 has a width narrower than that of the pressure-generating chamber 12 and maintains a constant flow resistance of the ink flowing in the pressure-generating chamber 12 from the communicating portion 13. Incidentally, in this embodiment, the ink-supplying path 14 is formed by narrowing the width of the flow path from one side, but it may be formed by narrowing the width of the flow path from both sides. Alternatively, the ink-supplying path 14 may be formed by narrowing the flow path from the thickness direction, instead of narrowing the width of the flow path. Thus, in this embodiment, the passage-forming substrate 10 is provided with a liquid passage composed of the pressure-generating chambers 12, the communicating portion 13, the ink-supplying paths 14, and the communicating paths 15.

The passage-forming substrate 10 is bonded to a nozzle plate 20 with, for example, an adhesive or a thermal adhesive film on the opened surface side. The nozzle plate is perforated with nozzle orifices 21 that communicate with the corresponding pressure-generating chambers 12 in the vicinity of the ends of the pressure-generating chambers 12 on the side opposite to the ink-supplying path 14. The nozzle plate 20 is made of, for example, a glass ceramic, a single-crystal silicon substrate, or stainless steel.

As described above, the elastic film 50 is disposed on the passage-forming substrate 10 on the opposite side to the opening surface side. On the elastic film 50, an adhesive layer 56 made of, for example, titanium oxide with a thickness of about 30 to 50 nm is disposed to increase the adhesion of a first electrode 60 to a base such as the elastic film 50. Furthermore, an insulating film made of, for example, zirconium oxide, is optionally disposed on the elastic film 50.

On the adhesive layer 56, a first electrode 60 made of platinum (Pt), a piezoelectric layer 70 composed of a buffer layer 72 of an oxide containing Bi and an element selected from Al, Si, Cr, and Mn and a complex oxide layer having a perovskite structure, which is described in detail below, and a second electrode 80 are laminated to constitute each piezoelectric element 300 as a pressure-generating means that varies the pressure in the corresponding pressure-generating chamber 12. The piezoelectric element 300 is a portion including the first electrode 60, the piezoelectric layer 70, and the second electrode 80. In general, one of the electrodes of each of the piezoelectric elements 300 is formed as a common electrode, and the other electrode and the piezoelectric layer 70 are formed by patterning for each pressure-generating chamber 12.

In this embodiment, the first electrode 60 is formed as the common electrode of the piezoelectric elements 300, and the second electrode 80 is the individual electrode of each piezoelectric element 300, but these may be reversed depending on a driving circuit or wiring. Herein, the piezoelectric element 300 and a diaphragm, which is deformed by driving the piezoelectric element 300, are collectively referred to as an actuator. In the above-mentioned example, the elastic film 50, the adhesive layer 56, the first electrode 60, and the optional insulating film function as the diaphragm, but the diaphragm is not limited thereto. For example, the elastic film 50 and the adhesive layer 56 may not be provided. Alternatively, the piezoelectric element 300 itself may substantially function as a diaphragm. In a case in which the first electrode 60 is directly disposed on the passage-forming substrate 10, the first electrode 60 is preferably protected with, for example, an insulative protecting film such that the first electrode 60 and the ink are not electrically connected with each other.

The buffer layer 72 of this embodiment is made of an oxide containing Bi and an element selected from Al, Si, Cr, and Mn. The buffer layer 72 having such a structure strongly orients the complex oxide layer 74 having a perovskite structure formed on the buffer layer 72 along a specific direction. That is, the buffer layer 72 functions as an orientation-controlling layer for preferentially orienting the complex oxide layer 74 along a specific direction.

Specifically, a buffer layer 72 of an oxide containing Bi and Al functions such that the crystals of the complex oxide layer 74 having a perovskite structure are strongly oriented along a (111) plane. A buffer layer 72 of an oxide containing Bi and Si functions such that the crystals of the complex oxide layer 74 are strongly oriented along a (110) plane. A buffer layer 72 of an oxide containing Bi and Mn or an oxide containing Bi and Cr functions such that the crystals of the complex oxide layer 74 are strongly oriented along a (100) plane.

Herein, the expression "crystals are strongly oriented along, for example, a (100) plane" includes a case in which the crystals are all oriented along a (100) plane and a case in which the crystals are preferentially oriented along a (100) plane.

The buffer layer 72 made of an oxide containing Bi and a specific element (Al, Si, Mn, or Cr) promotes the crystal growth of a piezoelectric layer to be formed on the buffer layer 72 in a specific direction, i.e., in this embodiment, the crystal growth of the complex oxide layer 74 having a perovskite structure containing Bi, Fe, Ba, and Ti in a specific direction to impart excellent crystallinity to the complex oxide layer 74. As a result, occurrence of cracks in the complex oxide layer 74 is significantly inhibited compared with the case not including the buffer layer 72 or the case of including a buffer layer 72 made of other elements. In addition, since a piezoelectric material varies the physical properties, such as displacement magnitude, dielectric constant, and Young's modulus, depending on the direction of the crystals, a piezoelectric material strongly oriented or mainly oriented (substantially uniform orientation) along an appropriate direction can show superior piezoelectric properties compared with piezoelectric materials of random orientation or a mixture of multiple orientations. Consequently, a piezoelectric material strongly oriented along a specific direction has excellent piezoelectric properties such as a high residual polarization value ($P_r$) and a high saturation polarization value ($P_m$).

A thinner buffer layer 72 is preferred. For example, a thickness of 10 nm or less is preferred. As described in examples below, a buffer layer 72 having a thickness of 10 nm or less can orient the crystals of the complex oxide layer 74 formed on the buffer layer 72 along a single direction. Consequently, occurrence of cracks is further inhibited. In addition, a reduction in thickness of the buffer layer 72 prevents concentration of a voltage in the buffer layer having a low dielectric constant and can prevent a reduction in voltage to be applied to the piezoelectric layer 70.

The buffer layer 72 is preferably disposed in an island form. Herein, the term "island form" refers to a state that a plurality of domains is formed so as to be separated from one another. In this embodiment, a plurality of domains (buffer layers) is formed such that the first electrode 60 portions are exposed in a planar view of the surface of the buffer layer 72 in a thickness direction. The buffer layer 72 formed in an island form can reduce the occupation area ratio of the buffer layer 72. As a result, when a voltage is applied to the piezoelectric layer 70, concentration of a voltage in the buffer layer having a low dielectric constant is further prevented, and a reduction in voltage to be applied to the piezoelectric layer 70 can be further prevented. This is also obvious from the results of test example 3 described below (see FIG. 20). A smaller occupation area ratio of the buffer layer 72 is preferred. The occupation area ratio is preferably 0.9 or less and more preferably 0.2 or less. In such a case, a voltage is efficiently applied to the piezoelectric layer 70 to provide a sufficient deformation magnitude and further improve the piezoelectric properties. The occupation area ratio of the buffer layer can be calculated by dividing the occupation area of the buffer layer by the total area of the first electrode. The areas of the buffer layer 72 and the first electrode 60 can be determined from, for example, a photograph taken with a scanning electron microscope.

The molar composition ratio of Bi to a specific element (Al, Si, Mn, or Cr) contained in the oxide constituting the buffer layer 72, Bi: a specific element, is 60 to 140:140 to 60, preferably, 100:100.

During the firing of a plurality of complex oxide layers 74, the component elements of the buffer layer 72 and the complex oxide layers 74 may diffuse therebetween. Accordingly, the buffer layer 72 may not be detected as a completely separated layer. However, for example, a region where the concentration of Al, Si, Mn, or Cr is high can be recognized on the first electrode 60 side of the piezoelectric layer 70, which is a proof of the presence of the buffer layer 72.

The complex oxide layer 74 disposed on the buffer layer 72 is made of a piezoelectric material composed of a complex oxide having a perovskite structure containing Bi, Fe, Ba, and Ti. Specifically, for example, the piezoelectric material is a complex oxide having a perovskite structure of a mixed crystal of bismuth ferrite system and bismuth titanate system. The perovskite structure, i.e., $ABO_3$ structure, is an octahedron formed by the A-site coordinated with 12 oxygen atoms and the B-site coordinated with 6 oxygen atoms. Bi and Ba are located on the A-site, and Fe and Ti are located on the B-site. Examples of the bismuth ferrite system include bismuth ferrite ($BiFeO_3$), bismuth ferrite aluminate ($Bi(Fe,Al)O_3$), bismuth ferrite manganate ($Bi(Fe,Mn)O_3$), bismuth lanthanum ferrite manganate (($Bi,La)(Fe,Mn)O_3$), bismuth barium ferrite manganate titanate (($Bi,Ba)(Fe,Mn,Ti)O_3$), bismuth ferrite cobaltate ($Bi(Fe,Co)O_3$), bismuth cerium ferrite (($Bi,Ce)FeO_3$), bismuth cerium ferrite manganate (($Bi,Ce)(Fe,Mn)O_3$), bismuth lanthanum cerium ferrite (($Bi,La,Ce)FeO_3$), bismuth lanthanum cerium ferrite manganate (($Bi,La,Ce)(Fe,Mn)O_3$), bismuth samarium ferrite (($Bi,Sm)FeO_3$), bismuth ferrite chromate ($Bi(Cr,Fe)O_3$), bismuth potassium ferrite manganate titanate (($Bi,K)(Fe,Mn,Ti)O_3$), and bismuth barium ferrite manganate zincate titanate (($Bi,Ba)(Fe,Mn,Zn,Ti)O_3$).

Examples of the bismuth titanate system include bismuth sodium titanate ($Bi_{1/2}Na_{1/2})TiO_3$), bismuth sodium potassium titanate (($Bi,Na,K)TiO_3$), bismuth barium sodium titanate zincate (($Bi,Na,Ba)(Zn,Ti)O_3$), and bismuth barium sodium titanate cuprate (($Bi,Na,Ba)(Cu,Ti)O_3$). Examples of the complex oxide also include bismuth potassium titanate (($Bi,K)TiO_3$) and bismuth chromate ($BiCrO_3$). The complex oxide layer 74 may be a mixture of any of the above-mentioned complex oxide and, for example, $Bi(Zn_{1/2}Ti_{1/2})O_3$, $(Bi_{1/2}K_{1/2})TiO_3$, or $(Li,Na,K)(Ta,Nb)O_3$. In this embodiment, the complex oxide layer 74 is made of a complex oxide containing Bi, Fe, Ba, and Ti and having a perovskite structure.

The complex oxide containing Bi, Fe, Ba, and Ti and having a perovskite structure is also referred to as a complex oxide having a perovskite structure of a mixed crystal of a bismuth ferrite and a barium titanate or a solid solution of a bismuth ferrite and a barium titanate uniformly solid-soluted. The bismuth ferrite and barium titanate are not each independently detected in an X-ray diffraction pattern. The bismuth ferrite and barium titanate are known piezoelectric materials each having a perovskite structure, and various compositions thereof are known. For example, in addition to the compositions represented by formulae $BiFeO_3$ or $BaTiO_3$, compositions having partial loss or excess of elements (Bi, Fe, Ba, Ti, or O) and compositions having partial substitution with other elements are known. In this embodiment, the terms "bismuth ferrite" and "barium titanate" each include compositions deviated from the stoichiometric composition by loss or excess and compositions having partial substitution with other elements, as long as the basic characteristics are not modified. The ratio between bismuth ferrite manganate and barium titanate can be variously changed.

The composition of the complex oxide layer 74 made of a complex oxide containing Bi, Fe, Ba, and Ti and having a perovskite structure is represented by (($Bi,Ba)(Fe,Ti)O_3$), typically, as a mixed crystal represented by Formula (1) below. This Formula (1) can also be represented as Formula (1') below. Formulae (1) and (1') express compositions based on stoichiometry. As described above, not only inevitable deviation in the composition by, for example, lattice mismatch or oxygen deficiency but also partial substitution with other elements are acceptable as long as a perovskite structure is formed. For example, when a stoichiometric ratio is assumed as 1, a composition having a ratio within the range of 0.85 to 1.20 is acceptable. Furthermore, even if compositions are different from each other when they are expressed by the following formula:

$$(1-x)[BiFeO_3]-x[BaTiO_3](0<x<0.40) \quad (1)$$

or $$(Bi_{1-x}Ba_x)(Fe_{1-x}Ti_x)O_3 (0<x<0.40) \quad (1'),$$

compositions having the same ratios of the elements on the A-site to the elements on the B-site can be assumed as the same complex oxides in some cases.

In the case of a complex oxide layer 74 made of a complex oxide having a perovskite structure containing Bi, Fe, Ba, and Ti, the complex oxide layer 74 may further contain an element in addition to Bi, Fe, Ba, and Ti. Examples of the additional element include Mn, Co, and Cr. Such a complex oxide layer 74 containing the additional element is also required to have a perovskite structure. The complex oxide layer 74 containing Mn, Co, or Cr has a structure in which Mn, Co, or Cr is located on the B-site. For example, in the case of a complex oxide layer 74 containing Mn, the complex oxide constituting the complex oxide layer 74 has a structure in which Fe of a solid solution of bismuth ferrite and barium titanate uniformly solid-saluted is partially substituted with Mn or a perovskite structure of a mixed crystal composed of bismuth ferrite manganate and barium titanate. It has been demonstrated that the basic characteristics are substantially the same as those of a complex oxide having a perovskite structure of a mixed crystal composed of bismuth ferrite and barium titanate and that the leakage characteristics are improved.

A complex oxide layer 74 containing Co or Cr is also improved in the leakage characteristics as in that containing Mn. Bismuth ferrite, barium titanate, bismuth ferrite manganate, bismuth ferrite cobaltate, and bismuth ferrite chromate are not each independently detected in an X-ray diffraction pattern. Examples described are Mn, Co, and Cr. It has been demonstrated that leakage characteristics are similarly improved in the complex oxide layer 74 containing other two different transition metal elements. The complex oxide layer 74 may further contain other known additives for improving the characteristics. In particular, a complex oxide layer 74 containing Mn can improve the leakage characteristics and also further inhibit occurrence of cracks, which is assumed to be due to sufficient affinity with the buffer layer 72 containing bismuth manganate.

The composition of the complex oxide layer 74 made of a complex oxide containing Mn, Co, or Cr in addition to Bi, Fe, Ba, and Ti and having a perovskite structure is represented by (($Bi,Ba)(Fe,Ti,Mn,Co,Cr)O_3$), typically, as a mixed crystal represented by Formula (2) below. This Formula (2) can also be represented as Formula (2') below. In Formulae (2) and (2'), M represents Mn, Co, or Cr. Formulae (2) and (2') express compositions based on stoichiometry. As described above, inevitable deviation in the composition by, for example, lattice mismatch or oxygen deficiency is acceptable as long as a perovskite structure is formed. For example, when a stoichiometric ratio is assumed as 1, a composition having a ratio within the range of 0.85 to 1.20 is acceptable. Furthermore, even if compositions are different from each other when they are expressed by the following formulae:

$$(1-x)[Bi(Fe_{1-y}M_y)O_3]-x[BaTiO_3](0<x<0.40, 0.01<y<0.10) \quad (2)$$

or $$(Bi_{1-x}Ba_x)((Fe_{1-y}M_y)_{1-x}Ti_x)O_3(0<x<0.40, 0.01<y<0.10) \quad (2'),$$

compositions having the same ratios of the elements on the A-site to the elements on the B-site can be assumed as the same complex oxides in some cases.

The complex oxide layer 74 may have any thickness. The thickness of the complex oxide layer 74 is 3 μm or less and preferably 0.3 to 1.5 μm.

Each second electrode 80 as the individual electrode of the piezoelectric element 300 is connected to a lead electrode 90 made of, for example, gold (Au) that is drawn out from the vicinity of the end on the ink-supplying path 14 side and extends onto the elastic film 50 and the optional insulating film.

On the passage-forming substrate 10 provided with such piezoelectric elements 300, that is, above the first electrode 60, the elastic film 50, the optional insulating film, and the lead electrodes 90, a protective substrate 30 having the manifold portion 31 constituting at least a part of a manifold 100 is bonded with an adhesive 35. In the embodiment, the manifold portion 31 is formed along the width direction of the pressure-generating chambers 12 so as to pass through the protective substrate 30 in the thickness direction and communicates with the communicating portion 13 of the passage-forming substrate 10 to constitute the manifold 100 serving as a common ink chamber for the pressure-generating chambers 12, as described above. Alternatively, the communicating portion 13 of the passage-forming substrate 10 may be divided so as to correspond to each pressure-generating chamber 12, and only the manifold portion 31 may serve as the manifold. Alternatively, for example, the passage-forming substrate 10 may be provided with only the pressure-generating chambers 12, and members (for example, the elastic film 50 and the optional insulating film) interposed between the passage-forming substrate 10 and the protective substrate 30 may be provided with the ink-supplying paths 14 communicating with the manifold 100 and the corresponding pressure-generating chambers 12.

The protective substrate 30 is provided with a piezoelectric element holding portion 32, at the region facing the piezoelectric elements 300, having a space that is enough not to hinder the movement of the piezoelectric elements 300. The space of the piezoelectric element holding portion 32 may be sealed or not be sealed as long as it is enough not to hinder the movement of the piezoelectric elements 300.

The protective substrate 30 is preferably made of a material having almost the same coefficient of thermal expansion as that of the passage-forming substrate 10. The protective substrate 30 is preferably made of glass or a ceramic material and is, in this embodiment, a single-crystal silicon substrate, which is the same material as that of the passage-forming substrate 10.

The protective substrate 30 is provided with a through-hole 33 passing through the protective substrate 30 in the thickness direction. The through-hole 33 is formed so that the vicinity of the end of the lead electrode 90 drawn out from each piezoelectric element 300 is exposed in the through-hole 33.

Furthermore, a driving circuit 120 for driving the piezoelectric elements 300 arranged in parallel is fixed on the protective substrate 30. The driving circuit 120 may be, for example, a circuit board or a semiconductor integrated circuit (IC). The driving circuit 120 and the lead electrodes 90 are electrically connected to each other through connecting wire 121 made of conductive wire such as bonding wire.

In addition, a compliance substrate 40 composed of a sealing film 41 and a fixing plate 42 is bonded to the protective substrate 30. Herein, the sealing film 41 is formed of a flexible material having a low rigidity and seals one side of the manifold portion 31. The fixing plate 42 is formed of a relatively hard material. The region of the fixing plate 42 facing the manifold 100 is completely removed in the thickness direction to form an opening 43. Therefore, the one side of the manifold 100 is sealed with only the sealing film 41 having flexibility.

In such an ink jet recoding head I of the embodiment, ink is fed through an ink inlet connected to exterior ink supplying means (not shown) to fill the inside from the manifold 100 to the nozzle orifices 21 with ink. A voltage is then applied between the first electrode 60 and the second electrode 80 corresponding to each pressure-generating chamber 12 according to recording signals from the driving circuit 120 to flexurally deform the elastic film 50, the adhesive layer 56, the first electrode 60, and the piezoelectric layer 70. Thereby, the pressure in each pressure-generating chamber 12 is increased, and ink droplets are discharged from the nozzle orifices 21.

Subsequently, an example of the process of producing the ink jet recording head of this embodiment will be described with reference to FIGS. 4A, 4B, 5A to 5D, 6A to 6C, 7A to 7C, 8A, and 8B, which are cross-sectional views of a pressure-generating chamber in the longitudinal direction. In this embodiment, an example of forming a complex oxide layer containing Bi, Fe, Ba, and Ti as the complex oxide layer 74 is described.

Figure 4A:
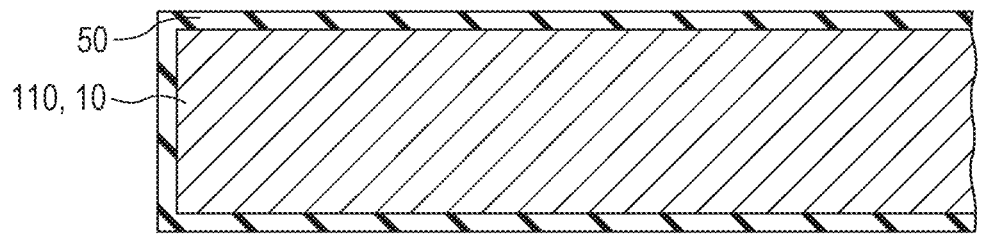
FIGS. 4A and 4B are cross-sectional views illustrating a step of producing the recording head according to Embodiment 1.
Figure 4B:
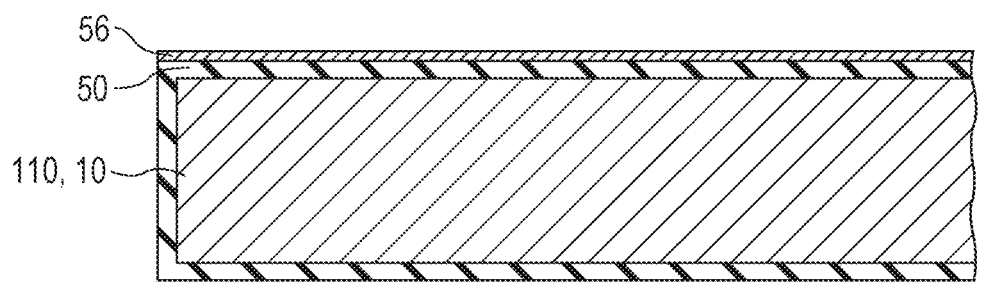

First, as shown in FIG. 4A, a silicon dioxide film of, for example, silicon dioxide ($SiO_2$), constituting the elastic film 50 is formed on a surface of a silicon wafer as the passage-forming substrate wafer 110 by, for example, thermal oxidization. Then, as shown in FIG. 4B, an adhesive layer 56 of, for example, titanium oxide is formed on the elastic film 50 (silicon dioxide film) by, for example, sputtering or thermal oxidation.

Figure 5A:
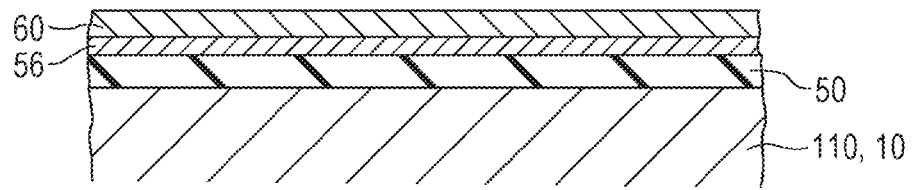
FIGS. 5A to 5D are cross-sectional views illustrating a step of producing the recording head according to Embodiment 1.
Figure 5B:
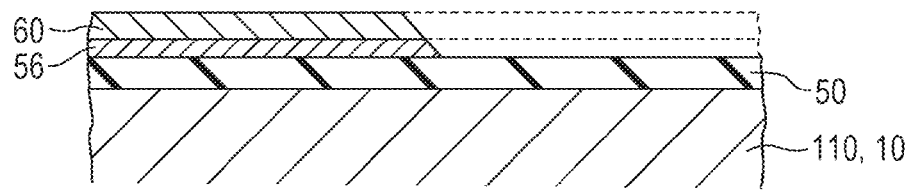

Subsequently, as shown in FIG. 5A, a platinum electrode is formed as the first electrode 60 on the entire adhesive layer 56 by, for example, sputtering or vapor deposition. Subsequently, as shown in FIG. 5B, the adhesive layer 56 and the first electrode 60 are simultaneously patterned so as to have an incline at their side faces using a resist (not shown) having a predetermined shape as a mask on the first electrode 60.

Subsequently, after removal of the resist, a buffer layer precursor film 71 is formed on the first electrode 60. For example, the buffer layer precursor film 71 can be formed into a buffer layer 72 of a metal oxide through metal-organic decomposition (MOD) by applying a solution containing a metal complex onto the first electrode 60, drying the coating, and further firing it at high temperature or through chemical solution deposition such as a sol-gel method. The buffer layer 72 may be formed by another method, such as laser ablation, sputtering, pulse laser deposition (PLD), CVD, or aerosol deposition.

Figure 5C:
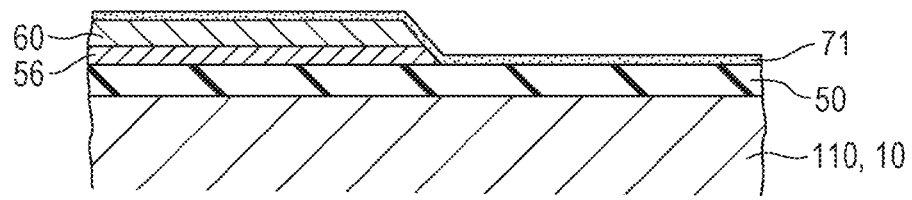

In a specific example of the procedure for forming the buffer layer 72 by chemical solution deposition, as shown in FIG. 5C, an MOD or sol solution containing a metal complex as a composition for forming the buffer layer (a precursor solution of the buffer layer) is applied onto the first electrode 60 of Pt by, for example, spin coating to form a buffer layer precursor film 71 (buffer layer precursor solution application step).

The buffer layer 72 in this embodiment is preferably formed in an island form. The buffer layer 72 in an island form can be formed by, for example, thinly applying a precursor solution for buffer layer onto the first electrode 60 at 100 to 5000 rpm for 2 to 60 sec. In such a case, a buffer layer 72 can be formed in an island form of about 5 to 30 nm.

The precursor solution for buffer layer to be applied is a solution or dispersion prepared by dissolving or dispersing, in an organic solvent, a mixture of metal complexes that can form an oxide of Bi and an element selected from Al, Si, Cr, and Mn by being fired. Examples of the metal complexes containing Bi, Al, Si, Cr, or Mn include alkoxides, organic acid salts, and β diketone complexes of the metals.

Examples of the metal complex containing Bi include bismuth 2-ethylhexanoate and bismuth acetate. Examples of the metal complex containing Al include aluminum 2-ethylhexanoate and aluminum acetate. Examples of the metal complex containing Si include silicon 2-ethylhexanoate and silicon acetate. Examples of the metal complex containing Cr include chromium 2-ethylhexanoate and chromium acetate. Examples of the metal complex containing Mn include manganese 2-ethylhexanoate and manganese acetate.

A metal complex containing two or more of Bi, Al, Si, Cr, and Mn may be used. Examples of the solvent of the precursor solution for buffer layer include propanol, butanol, pentanol, hexanol, octanol, ethylene glycol, propylene glycol, octane, decane, cyclohexane, xylene, toluene, tetrahydrofuran, acetic acid, and octylic acid.

Thus, the buffer layer 72 can be produced by, for example, applying a precursor solution containing a metal complex of Bi and a metal complex of Al, Si, Cr, or Mn onto the first electrode 60 of Pt and firing it. The raw materials in the precursor solution may have any composition that can provide an intended molar ratio of each metal.

Subsequently, the buffer layer precursor film 71 is heated at a predetermined temperature (e.g., 150° C. to 200° C.) for a predetermined time for drying (buffer layer-drying step). Subsequently, the dried buffer layer precursor film 71 is heated to a predetermined temperature (e.g., 350° C. to 450° C.) and is kept at the temperature for a predetermined time for degreasing (buffer layer-degreasing step). Herein, the term "degreasing" means that organic components contained in the buffer layer precursor film 71 are eliminated as, for example, $NO_2$, $CO_2$, or $H_2O$. The atmospheres for the buffer layer-drying step and the buffer layer-degreasing step are not limited, and these steps may be performed in the air, in an oxygen atmosphere, or in an inert gas.

Figure 5D:
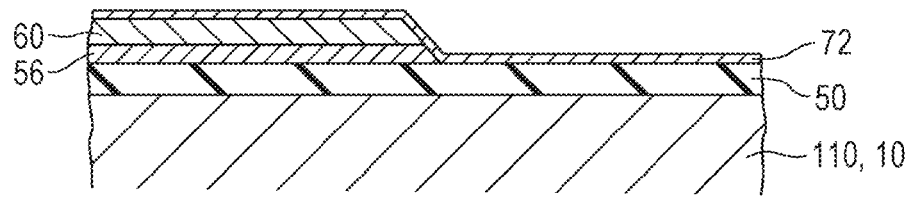

Then, as shown in FIG. 5D, the buffer layer precursor film 71 is heated to a predetermined temperature, for example, about 600° C. to 850° C., and is kept at the temperature for a predetermined time, for example, 1 to 10 min for crystallization to form a buffer layer 72 of an oxide containing Bi and an element selected from Al, Si, Cr, and Mn (firing step).

The atmosphere for the buffer layer-firing step is also not limited, and the step may be performed in the air, in an oxygen atmosphere, or in an inert gas. The buffer layer-drying step, the buffer layer-degreasing step, and the buffer layer-firing step are each performed with a heating apparatus such as a rapid thermal annealing (RTA) apparatus performing heating by irradiation with an infrared lamp or a hot plate.

The buffer layer 72 in this embodiment is formed in an island form on the first electrode 60. In a buffer layer in an island form, the applied voltage is prevented from concentrating in the buffer layer 72 having a low dielectric constant, and thereby the influence by a decrease in the voltage to be applied to the piezoelectric layer 70 is decreased. As a result, a voltage can be efficiently applied to the piezoelectric layer 70 to improve the piezoelectric properties such that a sufficient deformation magnitude is provided. In this embodiment, the buffer layer 72 is a monolayer formed by performing the application step once. The buffer layer 72 may be a multilayer.

Subsequently, a complex oxide layer 74 of a complex oxide containing Bi, Fe, Ba, and Ti is formed on the buffer layer 72. The complex oxide layer 74 can be produced by applying a solution containing a metal complex onto the buffer layer 72, followed by drying and degreasing. The complex oxide layer 74 may be produced by another method, such as laser ablation, sputtering, pulse laser deposition (PLD), CVD, or aerosol deposition.

Figure 6A:
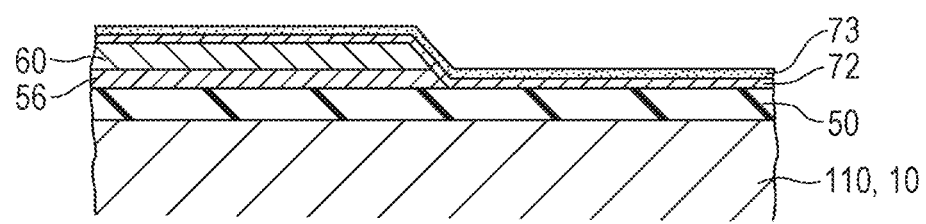
FIGS. 6A to 6C are cross-sectional views illustrating a step of producing the recording head according to Embodiment 1.

In a specific example of the procedure for forming the complex oxide layer 74 by chemical solution deposition, as shown in FIG. 6A, an oxide layer-forming composition (precursor solution) of an MOD or sol solution containing metal complexes, specifically, metal complexes containing Bi, Fe, Ba, and Ti is applied onto the buffer layer 72 by, for example, spin coating to form a precursor film (complex oxide precursor film) 73 of the complex oxide layer 74 (application step).

The precursor solution to be applied is a solution or dispersion prepared by dissolving or dispersing, in an organic solvent, a mixture of metal complexes that can form a complex oxide containing Bi, Fe, Ba, and Ti by being fired. In the case of forming a complex oxide layer 74 further containing Mn, Co, or Cr, a precursor solution further containing a metal complex including Mn, Co, or Cr is used.

The metal complexes of Bi, Fe, Ba, Ti, Mn, Co, and Cr may be mixed at a ratio that can provide an intended molar ratio of each metal.

Examples of the metal complexes containing Bi, Fe, Ba, Ti, Mn, Co, and Cr include alkoxides, organic acid salts, and β diketone complexes of the metals. Examples of the metal complex containing Bi include bismuth 2-ethylhexanoate and bismuth acetate. Examples of the metal complex containing Fe include iron 2-ethylhexanoate, iron acetate, and iron tris(acetylacetonate).

Examples of the metal complex containing Ba include barium isopropoxide, barium 2-ethylhexanoate, and barium acetylacetonate. Examples of the metal complex containing Ti include titanium isopropoxide, titanium 2-ethylhexanoate, and titanium (di-1-propoxide)bis(acetylacetonate). Examples of the metal complex containing Mn include manganese 2-ethylhexanoate and manganese acetate.

Examples of the metal complex containing Co include cobalt 2-ethylhexanoate and cobalt(III) acetylacetonate. Examples of the metal complex containing Cr include chromium 2-ethylhexanoate. A metal complex containing two or more of Bi, Fe, Ba, Ti, Mn, Co, and Cr may be used.

Examples of the solvent of the precursor solution include propanol, butanol, pentanol, hexanol, octanol, ethylene glycol, propylene glycol, octane, decane, cyclohexane, xylene, toluene, tetrahydrofuran, acetic acid, and octylic acid.

The complex oxide precursor film 73 is heated at a predetermined temperature (e.g., 150° C. to 200° C.) for a predetermined time for drying (drying step). Subsequently, the dried complex oxide precursor film 73 is heated to a predetermined temperature (e.g., 350° C. to 450° C.) and is kept at the temperature for a predetermined time for degreasing (degreasing step). Herein, the term "degreasing" means that organic components contained in the complex oxide precursor film 73 are eliminated as, for example, $NO_2$, $CO_2$, or $H_2O$. The atmospheres for the drying step and the degreasing step are not limited, and these steps may be performed in the air, in an oxygen atmosphere, or in an inert gas. The application step, drying step, and degreasing step may be performed a plurality of times.

Figure 6B:
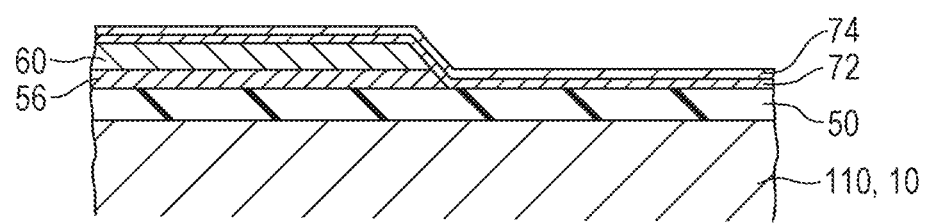

Then, as shown in FIG. 6B, the complex oxide precursor film 73 is heated to a predetermined temperature, for example, about 600° C. to 850° C., and is kept at the temperature for a predetermined time, for example, 1 to 10 min for firing (firing step). As a result, crystallization occurs to provide a complex oxide layer 74 made of a complex oxide containing Bi, Fe, Ba, and Ti and having a perovskite structure. This firing step may also be performed in any atmosphere and may be performed in the air, in an oxygen atmosphere, or in an inert gas. The drying step, the degreasing step, and the firing step are each performed with a heating apparatus such as a rapid thermal annealing (RTA) apparatus performing heating by irradiation with an infrared lamp or a hot plate.

Figure 6C:
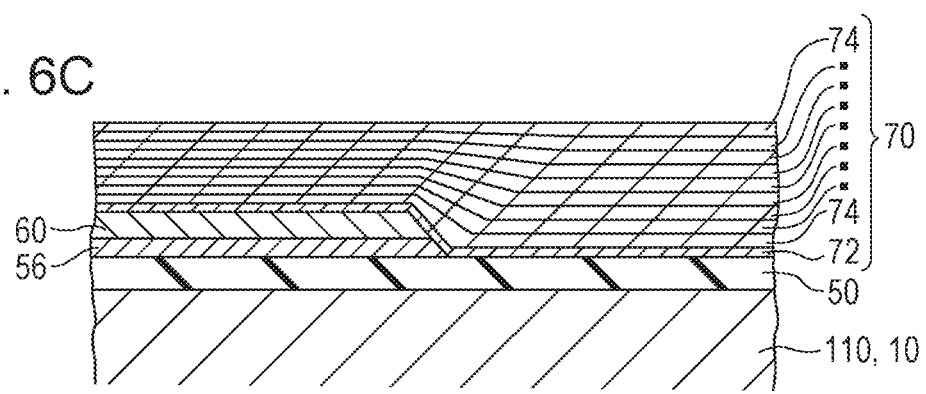

The above-described application step, drying step, and degreasing step, or the application step, drying step, degreasing step, and firing step are repeated a plurality of times to form multiple complex oxide layers 74 and thereby provide an intended thickness. As a result, as shown in FIG. 6C, a piezoelectric layer 70 having a predetermined thickness composed of the buffer layer 72 and the multiple complex oxide layers 74 is formed. For example, when the thickness of each application of a solution is about 0.1 μm, the total thickness of the piezoelectric layer 70 composed of, for example, one buffer layer 72 and ten complex oxide layers 74 is about 1.0 μm. In this embodiment, the complex oxide layer 74 is a multilayer, but it may be a monolayer.

The such formation of the buffer layer 72 of an oxide containing Bi and one element selected from Al, Si, Cr, and Mn can significantly inhibit occurrence of cracks in the layer of a piezoelectric material containing Bi, Fe, Ba, and Ti (in this embodiment, complex oxide layer 74) formed on the buffer layer 72, compared with the case of not forming the buffer layer 72. This is presumed to be caused by that the buffer layer 72 promotes the crystal growth of the complex oxide layer 74 having a perovskite structure formed on the buffer layer 72. The orientational properties of the complex oxide layer 74 formed on the buffer layer 72 are restricted by the buffer layer 72. Specifically, the complex oxide layer 74 is strongly oriented along a specific direction depending on the composition and thickness of the buffer layer 72.

In this embodiment, the buffer layer is made of an oxide containing Bi and an element selected from Al, Si, Cr, and Mn, and thereby the crystals of the complex oxide layer 74 forms a film strongly oriented along a specific direction. As a result, the complex oxide layer 74 has excellent crystallinity to prevent occurrence of cracks. In addition, a film of crystals strongly oriented along a specific direction can show superior piezoelectric properties compared with random orientation or a mixture of multiple orientations. Consequently, the piezoelectric layer 70 including the complex oxide layer 74 according to this embodiment has excellent piezoelectric properties.

After the formation of the piezoelectric layer 70, as shown in FIG. 7A, a second electrode 80 of, for example, Pt is formed on the piezoelectric layer 70 by sputtering. Subsequently, the piezoelectric layer 70 and the second electrode 80 are simultaneously patterned in the regions corresponding to the pressure-generating chambers 12 to form piezoelectric elements 300 each composed of the first electrode 60, the piezoelectric layer 70, and the second electrode 80. The patterning of the piezoelectric layer 70 and the second electrode 80 can be performed at once by dry etching through a resist (not shown) having a predetermined shape. Then, annealing may be performed in a temperature range of 600° C. to 850° C. By doing so, the interface between the piezoelectric layer 70 and the first electrode 60 or the second electrode 80 can be improved, and also the crystallinity of the piezoelectric layer 70 can be further improved.

Then, as shown in FIG. 7B, a lead electrode 90 of, for example, Au is formed on the entire surface of the passage-forming substrate wafer 110 and then is patterned through a mask pattern (not shown) of a resist or the like to form the lead electrodes 90 corresponding to the respective piezoelectric elements 300.

Then, as shown in FIG. 7C, a protective substrate wafer 130 that is a silicon wafer for forming a plurality of protective substrates 30 is bonded to the passage-forming substrate wafer 110 on the piezoelectric elements 300 side with an adhesive 35, and, subsequently, the passage-forming substrate wafer 110 is thinned to a predetermined thickness.

Figure 8A:
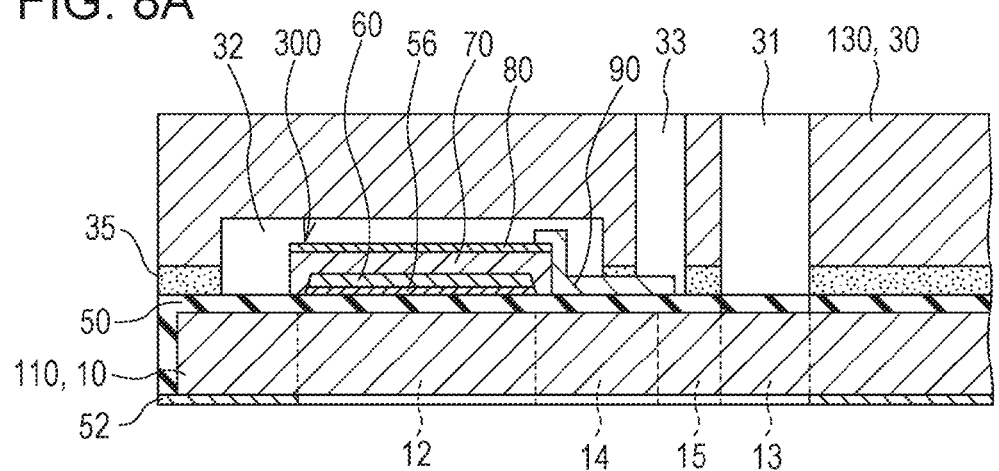
FIGS. 8A and 8B are cross-sectional views illustrating a step of producing the recording head according to Embodiment 1.

Subsequently, as shown in FIG. 8A, another mask film 52 is formed on the passage-forming substrate wafer 110 and is patterned into a predetermined shape.

Figure 8B:
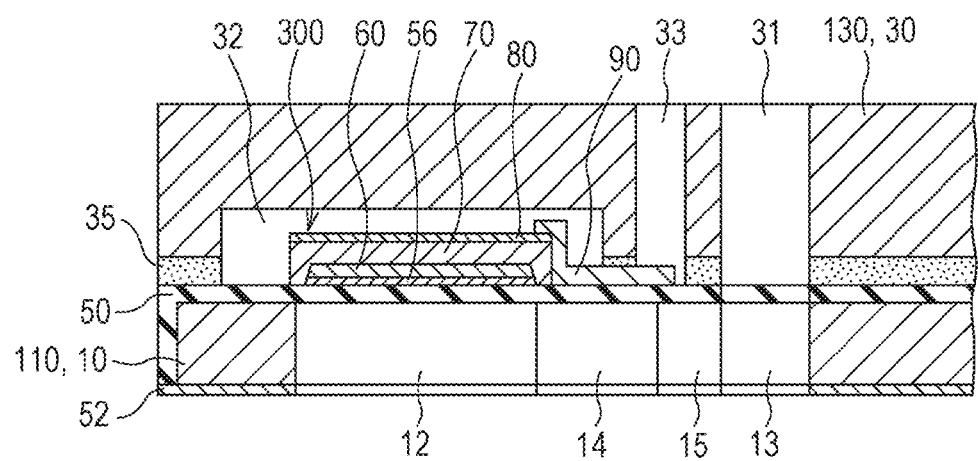

Then, as shown in FIG. 8B, the passage-forming substrate wafer 110 is anisotropically etched (wet-etched) using an alkaline solution, such as KOH, through the mask film 52 to form the pressure-generating chambers 12, the communicating portion 13, the ink-supplying paths 14, and the communicating paths 15 corresponding to the piezoelectric elements 300.

Then, unneeded portions at the outer peripheral portions of the passage-forming substrate wafer 110 and the protective substrate wafer 130 are removed by cutting, e.g., by dicing. The mask film 52 on the surface of the passage-forming substrate wafer 110 on the opposite side to the protective substrate wafer 130 is removed. Subsequently, a nozzle plate 20 perforated with nozzle orifices 21 is bonded to the passage-forming substrate wafer 110, and a compliance substrate 40 is bonded to the protective substrate wafer 130, and the passage-forming substrate wafer 110 and other associated components are divided into individual chip-sized passage-forming substrates 10 and other components as shown in FIG. 1 to give the ink jet recording head I of the embodiment.

EXAMPLES

The invention will now be more specifically described by examples, but is not limited to the following examples. Table 1 shows the conditions for producing buffer layers of Examples 1 to 7 and Comparative Examples 1 to 11 and the plane indices of piezoelectric layers determined from the results in test example 1 described below.

Example 1

A silicon oxide ($SiO_2$) film having a thickness of 1200 nm was formed on a surface of a (100) single-crystal silicon (Si) substrate by thermal oxidation. Subsequently, a titanium film having a thickness of 40 nm was formed on the $SiO_2$ film by RF magnetron sputtering and was then thermally oxidized into a titanium oxide film. Subsequently, a platinum film (first electrode 60) oriented along a (111) plane and having a thickness of 100 nm was formed on the titanium oxide film by RF magnetron sputtering.

Subsequently, a buffer layer 72 containing Bi and Al was formed on the first electrode 60 as follows: A solution of bismuth 2-ethylhexanoate and aluminum 2-ethylhexanoate in n-octane was prepared such that the molar ratio, Bi:Al, was 100:100 and that the molar concentration of Bi was 0.03125 mol/L. This solution was used as a precursor solution for buffer layer.

Subsequently, the precursor solution for buffer layer was dropwise applied onto the substrate provided with the titanium oxide film and the platinum film, and the substrate was rotated at 3000 rpm for 20 sec to form a buffer layer precursor film 71 in an island form by spin coating such that the surface of the first electrode 60 is partially exposed (buffer layer application step).

Subsequently, the product was dried on a hot plate at 180° C. for 2 min (buffer layer-drying step). Subsequently, degreasing was performed at 350° C. for 2 min (buffer layer-degreasing step). Then, the product was heated up to 700° C. at 3° C./sec, and firing was performed at 700° C. for 2 min in an oxygen atmosphere with a rapid thermal annealing (RTA) apparatus to form a buffer layer 72 containing Bi and Al, having a thickness of 10 nm, and in an island form (buffer layer-firing step). The occupation area ratio of the buffer layer 72 in the island form to the total area of the first electrode was about 0.2.

Subsequently, a complex oxide layer 74 was formed on the buffer layer 72 as follows: Solutions of bismuth 2-ethylhexanoate, iron 2-ethylhexanoate, barium 2-2-ethylhexanoate, titanium 2-ethylhexanoate, and manganese ethylhexanoate in n-octane were mixed such that the molar ratio of each element, Bi:Fe:Ba:Ti:Mn, was 75:71.25:25:25:3.75 to prepare a precursor solution.

The precursor solution was dropwise applied onto the buffer layer 72, and the substrate was rotated at 3000 rpm to form a complex oxide precursor film 73 by spin coating (application step). Subsequently, the product was dried on a hot plate at 180° C. for 2 min (drying step). Subsequently, degreasing was performed at 350° C. for 2 min (degreasing step). Then, the product was heated up to 750° C. at 400° C./sec and was fired at 750° C. for 2 min in an oxygen atmosphere with an RTA apparatus for crystallization. As a result, a complex oxide layer 74 of a complex oxide containing Bi, Fe, Ba, Ti, and Mn and having a perovskite structure was formed in a thickness of 80 nm (firing step). As a result, a piezoelectric layer 70 having a thickness of about 90 nm and composed of a buffer layer 72 and a complex oxide layer 74 of a single layer was formed.

Separately, a piezoelectric layer 70 having a thickness of about 700 nm was formed by a similar procedure. Specifically, a complex oxide layer 74 having a thickness of nm was formed in the firing step, and then the application step, drying step, and degreasing step of the complex oxide precursor film 73 were repeated twice, and the firing step was performed. The process from the application step to the firing step was repeated four times. As a result, a piezoelectric layer 70 having a thickness of about 700 nm and composed of a buffer layer 72 and a complex oxide layer 74 of a laminated structure was formed.

Example 2

A piezoelectric layer 70 having a thickness of about 100 nm and composed of a buffer layer 72 and a complex oxide layer 74 of a single layer was formed as in Example 1 except that a solution of bismuth 2-ethylhexanoate and aluminum 2-ethylhexanoate in n-octane prepared such that the molar concentration of Bi was 0.06250 mol/L was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 20 nm.

Example 3

A piezoelectric layer 70 having a thickness of about 120 nm and composed of a buffer layer 72 and a complex oxide layer 74 of a single layer was formed as in Example 1 except that a solution of bismuth 2-ethylhexanoate and aluminum 2-ethylhexanoate in n-octane prepared such that the molar concentration of Bi was 0.12500 mol/L was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 40 nm.

Example 4

A piezoelectric layer 70 having a thickness of about 160 nm and composed of a buffer layer 72 and a complex oxide layer 74 of a single layer was formed as in Example 1 except that a solution of bismuth 2-ethylhexanoate and aluminum 2-ethylhexanoate in n-octane prepared such that the molar concentration of Bi was 0.25000 mol/L was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 80 nm.

Example 5

A piezoelectric layer 70 having a thickness of about 90 nm and composed of a buffer layer 72 and a complex oxide layer 74 of a single layer was formed as in Example 1 except that a solution of bismuth 2-ethylhexanoate and silicon 2-ethylhexanoate in n-octane prepared such that the molar ratio, Bi:Si, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm. The occupation area ratio of the buffer layer 72 to the total area of the first electrode was about 0.2.

Example 6

A piezoelectric layer 70 having a thickness of about 90 nm and composed of a buffer layer 72 and a complex oxide layer 74 of a single layer was formed as in Example 1 except that a solution of bismuth 2-ethylhexanoate and chromium 2-ethylhexanoate in n-octane prepared such that the molar ratio, Bi:Cr, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm. The occupation area ratio of the buffer layer 72 to the total area of the first electrode was about 0.2.

Example 7

A piezoelectric layer 70 having a thickness of about 90 nm and composed of a buffer layer 72 and a complex oxide layer 74 of a single layer was formed as in Example 1 except that a solution of bismuth 2-ethylhexanoate and manganese 2-ethylhexanoate in n-octane prepared such that the molar ratio, Bi:Mn, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm. The occupation area ratio of the buffer layer 72 to the total area of the first electrode was about 0.2.

Comparative Example 1

A piezoelectric layer 70 having a thickness of about 90 nm and composed of a buffer layer 72 and a complex oxide layer 74 of a single layer was formed as in Example 1 except that a solution of bismuth 2-ethylhexanoate and yttrium 2-ethylhexanoate in n-octane prepared such that the molar ratio, Bi:Y, was 100:100 was used as the precursor solution for buffer layer. Separately, a piezoelectric layer 70 having a thickness of about 700 nm and composed of a buffer layer 72 and a complex oxide layer 74 of a laminated structure was formed by a similar procedure. The buffer layer 72 had a thickness of 10 nm.

Comparative Example 2

A piezoelectric layer 70 having a thickness of about 90 nm and composed of a buffer layer 72 and a complex oxide layer 74 of a single layer was formed as in Example 1 except that a solution of bismuth 2-ethylhexanoate and gallium 2-ethylhexanoate in n-octane prepared such that the molar ratio, Bi:Ga, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 3

A piezoelectric layer 70 having a thickness of about 90 nm and composed of a buffer layer 72 and a complex oxide layer 74 of a single layer was formed as in Example 1 except that a solution of bismuth 2-ethylhexanoate and tantalum 2-ethylhexanoate in n-octane prepared such that the molar ratio, Bi:Ta, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 4

A piezoelectric layer 70 having a thickness of about 90 nm and composed of a buffer layer 72 and a complex oxide layer 74 of a single layer was formed as in Example 1 except that a solution of bismuth 2-ethylhexanoate and zirconium 2-ethylhexanoate in n-octane prepared such that the molar ratio, Bi:Zr, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 5

A piezoelectric layer 70 having a thickness of about 90 nm and composed of a buffer layer 72 and a complex oxide layer 74 of a single layer was formed as in Example 1 except that a solution of bismuth 2-ethylhexanoate and niobium 2-ethylhexanoate in n-octane prepared such that the molar ratio, Bi:Nb, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 6

A piezoelectric layer 70 having a thickness of about 90 nm and composed of a buffer layer 72 and a complex oxide layer 74 of a single layer was formed as in Example 1 except that a solution of bismuth 2-ethylhexanoate and zinc 2-ethylhexanoate in n-octane prepared such that the molar ratio, Bi:Zn, was 100:100 was used as the precursor solution for buffer layer. Separately, a piezoelectric layer 70 having a thickness of about 700 nm and composed of a buffer layer 72 and a complex oxide layer 74 of a laminated structure was formed by a similar procedure. The buffer layer 72 had a thickness of 10 nm.

Comparative Example 7

A piezoelectric layer 70 having a thickness of about 90 nm and composed of a buffer layer 72 and a complex oxide layer 74 of a single layer was formed as in Example 1 except that a solution of bismuth 2-ethylhexanoate and nickel 2-ethylhexanoate in n-octane prepared such that the molar ratio, Bi:Ni, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 8

A piezoelectric layer 70 having a thickness of about 90 nm and composed of a buffer layer 72 and a complex oxide layer 74 of a single layer was formed as in Example 1 except that a solution of bismuth 2-ethylhexanoate and copper 2-ethylhexanoate in n-octane prepared such that the molar ratio, Bi:Cu, was 100:100 was used as the precursor solution for buffer layer. Separately, a piezoelectric layer 70 having a thickness of about 700 nm and composed of a buffer layer 72 and a complex oxide layer of a laminated structure was formed by a similar procedure. The buffer layer 72 had a thickness of 10 nm.

Comparative Example 9

A piezoelectric layer 70 having a thickness of about 90 nm and composed of a buffer layer 72 and a complex oxide layer 74 of a single layer was formed as in Example 1 except that a solution of bismuth 2-ethylhexanoate and vanadium 2-ethylhexanoate in n-octane prepared such that the molar ratio, Bi:V, was 100:100 was used as the precursor solution for buffer layer. Separately, a piezoelectric layer 70 having a thickness of about 700 nm and composed of a buffer layer 72 and a complex oxide layer 74 of a laminated structure was formed by a similar procedure. The buffer layer 72 had a thickness of 10 nm.

Comparative Example 10

A piezoelectric layer 70 having a thickness of about 90 nm and composed of a buffer layer 72 and a complex oxide layer 74 of a single layer was formed as in Example 1 except that a solution of bismuth 2-ethylhexanoate and boron 2-ethylhexanoate in n-octane prepared such that the molar ratio, Bi:B, was 100:100 was used as the precursor solution for buffer layer. Separately, a piezoelectric layer 70 having a thickness of about 700 nm and composed of a buffer layer 72 and a complex oxide layer 74 of a laminated structure was formed by a similar procedure. The buffer layer 72 had a thickness of 10 nm.

Comparative Example 11

A piezoelectric layer 70 having a thickness of about 80 nm and composed of a complex oxide layer 74 of a single layer was formed as in Example 1 except that the buffer layer was not formed and that a precursor solution having the same composition as that of the piezoelectric layer containing Bi, Fe, Ba, Ti, and Mn was used instead of the precursor solution for buffer layer. Separately, a piezoelectric layer 70 having a thickness of about 700 nm and composed of a complex oxide layer 74 of a laminated structure was formed by a similar procedure.

Test Example 1

The X-ray diffraction peaks of the piezoelectric layers including the complex oxide layers having a thickness of 80 nm of Examples 1 to 7 and Comparative Examples 1 to 11 were measured with "D8 Discover" manufactured by Bruker AXS, Inc., and two-dimensional mapping showing X-ray diffraction intensities was performed. FIGS. 9 to 12 show the X-ray diffraction peaks. FIGS. 13, 14A, 14B, 15A, 15B, 16A, and 16B show two-dimensional mapping when a two-dimensional detector for X-ray diffraction was used for the piezoelectric layers of Examples 7 and 1 to 5 and Comparative Example 11.

Figure 9:
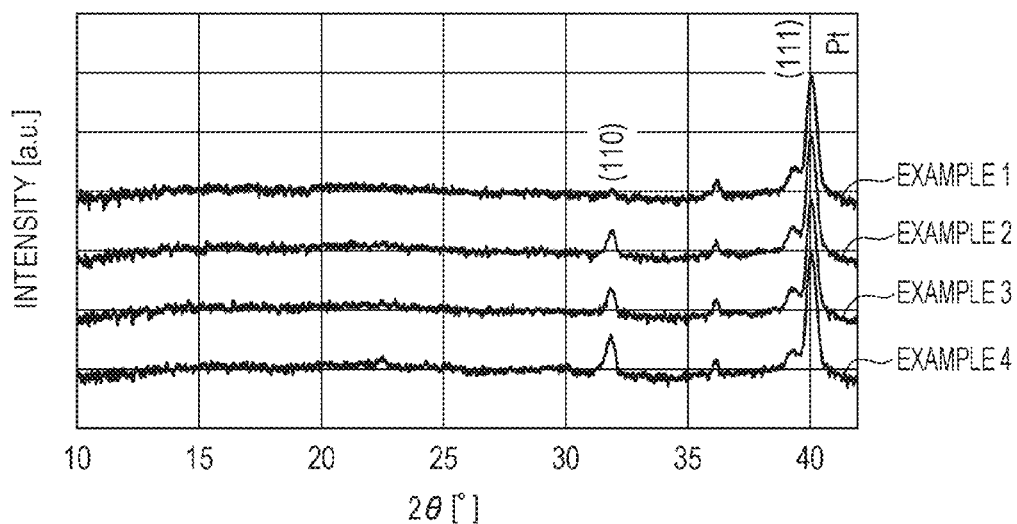
FIG. 9 is a graph showing X-ray diffraction peaks of piezoelectric layers in Examples 1 to 4.

The measurement results of X-ray diffraction peaks will be described. As shown in FIG. 9, it was demonstrated that in the piezoelectric layers each including a buffer layer containing Bi and Al of Examples 1 to 4, the crystals of the piezoelectric layers, in particular, the crystals of the piezoelectric layer including a buffer layer having a thickness of 10 nm, were strongly oriented along a (111) plane, whereas the crystals of the piezoelectric layers including buffer layers having a thickness of 20 nm, 40 nm, or 80 nm contained a small amount of components oriented along a (110) plane.

Figure 10:
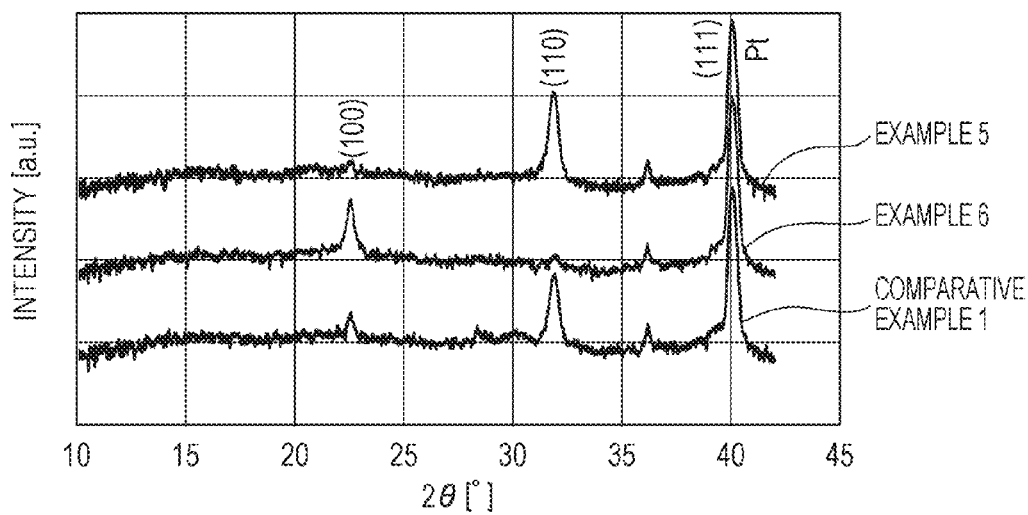
FIG. 10 is a graph showing X-ray diffraction peaks of piezoelectric layers in Examples 5 and 6 and Comparative Example 1.
Figure 11:
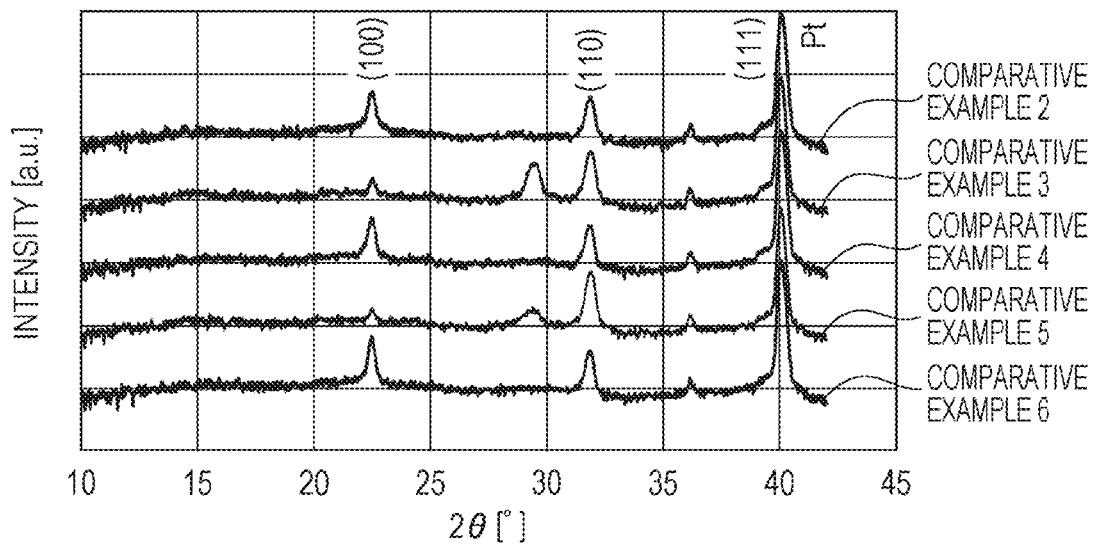
FIG. 11 is a graph showing X-ray diffraction peaks of piezoelectric layers in Comparative Examples 2 to 6.
Figure 12:
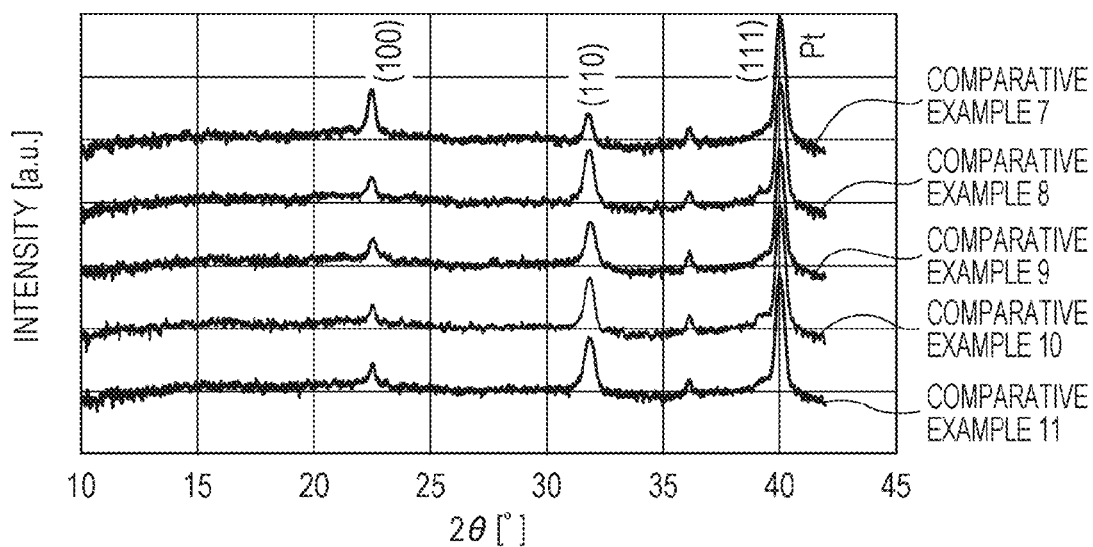
FIG. 12 is a graph showing X-ray diffraction peaks of piezoelectric layers in Comparative Examples 7 to 11.
Figure 13:
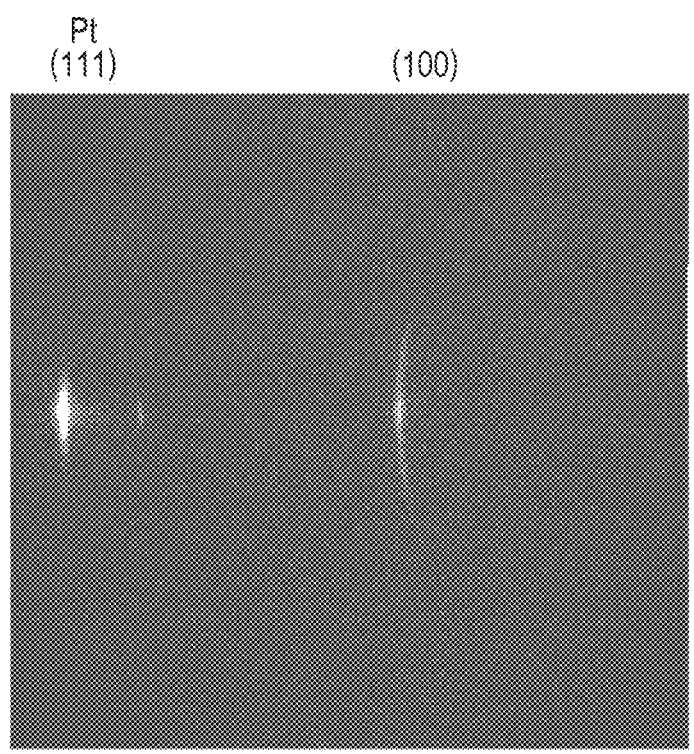
FIG. 13 shows two-dimensional mapping of the piezoelectric layer in Example 7 with a two-dimensional detector for X-ray diffraction.

As shown in FIG. 10, it was demonstrated that the crystals of the piezoelectric layer including a buffer layer containing Bi and Si in Example 5 were strongly oriented along a (110) plane and that in the crystals of the piezoelectric layer including a buffer layer containing Bi and Cr in Example 6 were strongly oriented along a (100) plane. As shown in FIG. 13, it was demonstrated that the crystals of the piezoelectric layer including a buffer layer containing Bi and Mn in Example 7 were strongly oriented along a (100) plane. The orientations of the crystals of Examples 1 to 6 were also confirmed by two-dimensional mapping described below (see FIGS. 14A, 14B, 15A, 15B, and 16A).

In each case of the buffer layers containing Bi and an element other than Al, Si, Cr, and Mn in Comparative Examples 1 to 10, the crystals of the piezoelectric layers showed peaks corresponding to a (100) plane and a (110) plane. In also the piezoelectric layer not including the buffer layer in Comparative Example 11, peaks corresponding to a (100) plane and a (110) plane were observed. These results demonstrate that the crystals of the piezoelectric layers of Comparative Examples 1 to 11 were not oriented (random orientation) or were in a mixed phase of (100) orientation, (110) orientation, and non-orientation (random orientation). It was also demonstrated that in Comparative Examples 1, 3, and 5, peaks were observed in 28° to 30° to show deposition of heterogeneous phases other than perovskite. The crystals of the piezoelectric layer of Comparative Example 11 were oriented along a (100) plane and a (110) plane, which was also confirmed by two-dimensional mapping described below (see FIG. 16B).

The two-dimensional mapping will be described. In the two-dimensional mapping shown in FIGS. 13, 14A, 14B, 15A, 15B, 16A, and 16B, the position of 2θ of a two-dimensional detector was fixed at 25°, and the angle of each sample was shifted. The diffraction peaks of (100), (110), and (111) planes appear at an angle 2θ of about 22.4°, 31.8°, and 38.2°, respectively.

The orientation of a piezoelectric material having a perovskite structure can be distinguished by such two-dimensional mapping. Specifically, the method of distinguishing orientation along a (110) plane will be described as an example. The following distinguishing method can be similarly applied to orientation along a (100) or (111) plane. In two-dimensional mapping of a piezoelectric material having a perovskite structure, the diffraction line is observed as a ring with a uniform intensity at an angle 2θ of about 32° in random orientation; the diffraction line is observed as a spot at the central portion in strong orientation along a (110) plane; and the diffraction line is observed as a ring with a uniform intensity near the periphery and as a spot near the center in a mixture of random orientation and strong orientation along a (110) plane. If another strong orientation is present, a spot may be observed at a position other than the central portion on the wayside at which a ring appears in random orientation. That is, strong orientation along a (110) plane refers to a diffraction line observed as a spot in the central portion at an angle 2θ of about 32°. In evaluation of orientation, a similar procedure is performed for each plane.

Figure 14A:
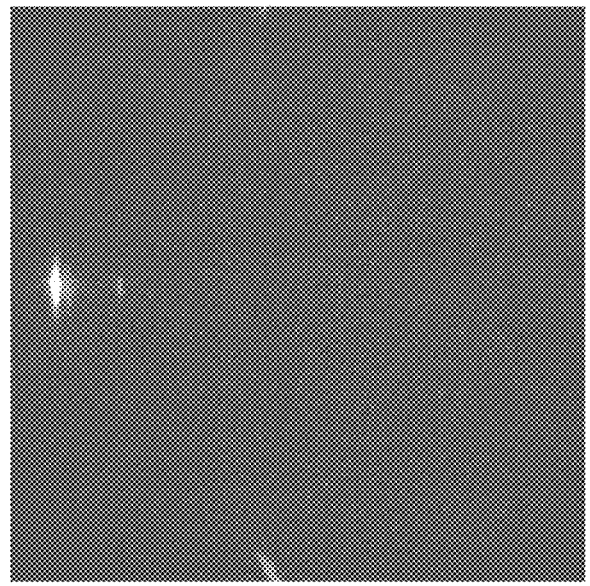
FIG. 14A shows two-dimensional mapping of the piezoelectric layer in Example 1 with a two-dimensional detector for X-ray diffraction.
Figure 14B:
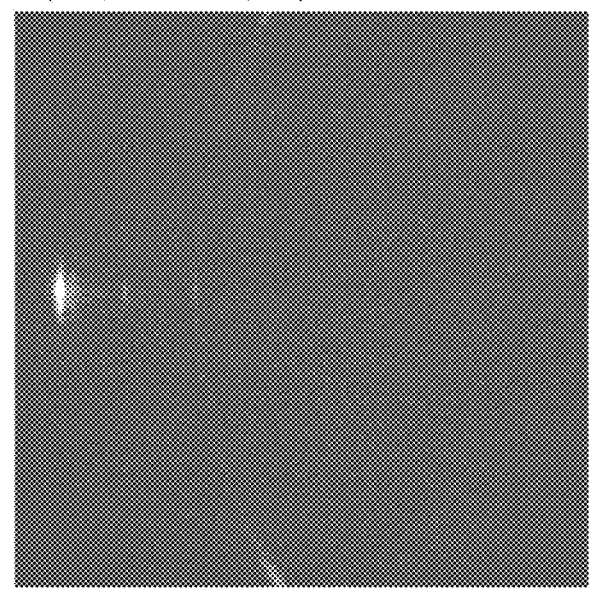
FIG. 14B shows two-dimensional mapping of the piezoelectric layer in Example 2 with a two-dimensional detector for X-ray diffraction.
Figure 15A:
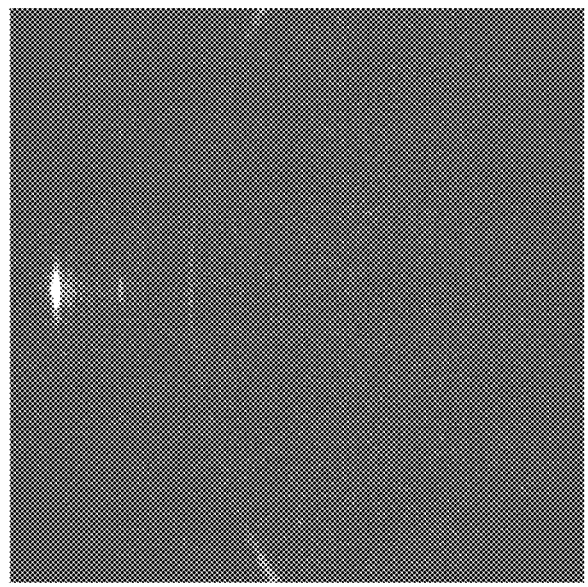
FIG. 15A shows two-dimensional mapping of the piezoelectric layer in Example 3 with a two-dimensional detector for X-ray diffraction.
Figure 15B:
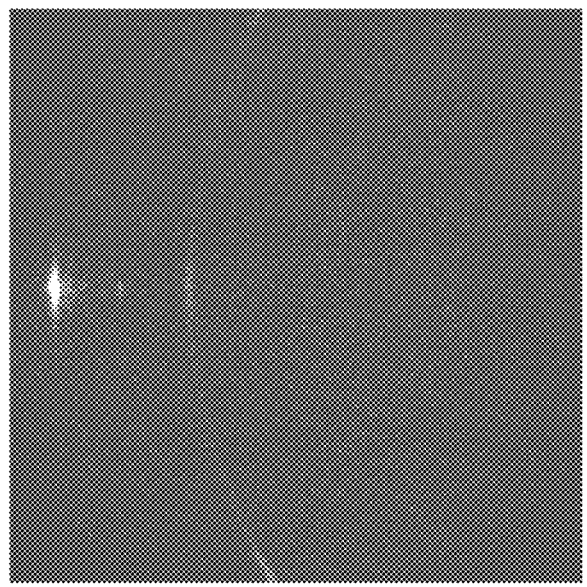
FIG. 15B shows two-dimensional mapping of the piezoelectric layer in Example 4 with a two-dimensional detector for X-ray diffraction.

As shown in FIG. 13, in the piezoelectric layer of Example 7, a diffraction line was observed as a spot at the center of the position showing (100) orientation, which demonstrates strong orientation along a (100) plane. As shown in FIG. 14A, in the piezoelectric layer of Example 1, a diffraction line was observed as a spot at the center of the position showing (111) orientation, which demonstrates strong orientation along a (111) plane. However, as shown in FIGS. 14B, 15A, and 15B, in the piezoelectric layers of Examples 2 to 4, diffraction lines were observed as spots at the center of the position showing (111) orientation, and also diffraction lines were observed as rings from the center to the periphery of the position showing (110) orientation, which demonstrates that the piezoelectric layers were strongly oriented along a (111) plane as in that in Example 1, though a small amount of components oriented along a (110) plane.

Figure 16A:
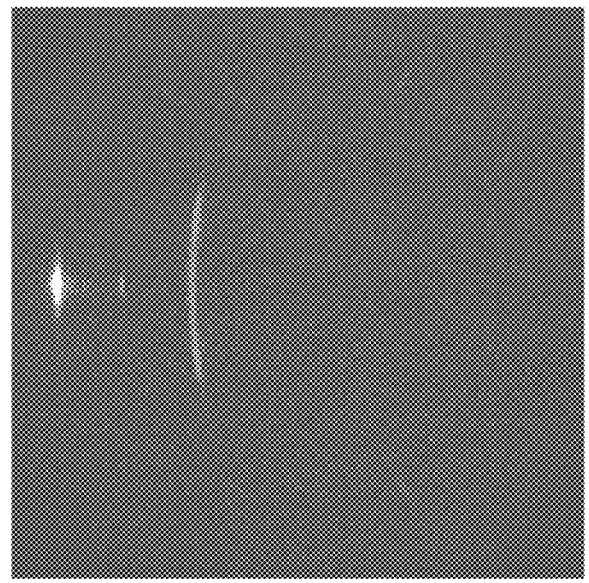
FIG. 16A shows two-dimensional mapping of the piezoelectric layer in Example 5 with a two-dimensional detector for X-ray diffraction.

As shown in FIG. 16A, in the piezoelectric layer of Example 5, a diffraction line was observed as a spot at the center of the position showing (110) orientation, which demonstrates strong orientation along a (110) plane.

Figure 16B:
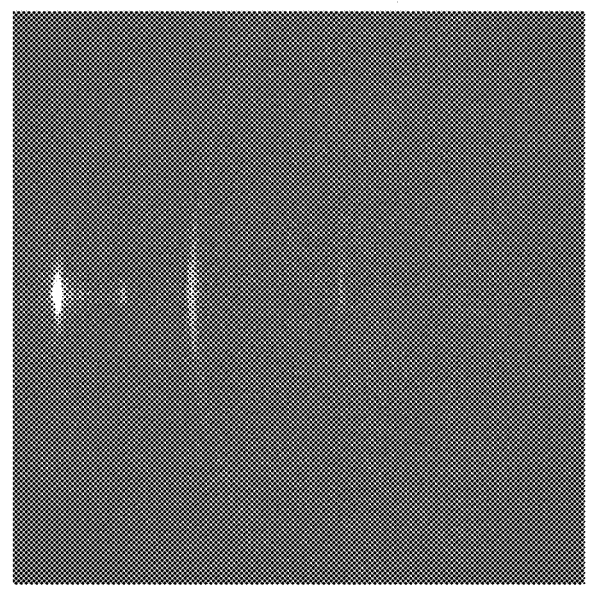
FIG. 16B shows two-dimensional mapping of the piezoelectric layer in Comparative Example 11 with a two-dimensional detector for X-ray diffraction.

As shown in FIG. 16B, in the piezoelectric layer of Comparative Example 11, a diffraction line was observed as a spot at the center of the position showing (111) orientation, and also a diffraction line was observed as a ring from the center to the periphery of the position showing (110) orientation, which demonstrates orientation along a (111) plane and orientation along a (110) plane. It was confirmed by these results that the orientational properties of a piezoelectric layer judged by two-dimensional mapping agree with the measurement results of X-ray diffraction peaks.

The results described above demonstrate that the buffer layer of an oxide containing Bi and an element selected from Al, Si, Cr, and Mn can promote the crystal growth of the piezoelectric layer having a perovskite structure such that the crystals of the piezoelectric layer are strongly oriented in a specific direction. The crystals aligned in a specific direction have excellent crystallinity and prevent occurrence of cracks in the piezoelectric layer. The detail will be described by test example 2.

at a magnitude of 100 before formation of the second electrode 80, i.e., immediately after the formation of the piezoelectric layer. The results of Example 7 and Comparative Example 11 are respectively shown in FIGS. 17 and 18.

Figure 17:
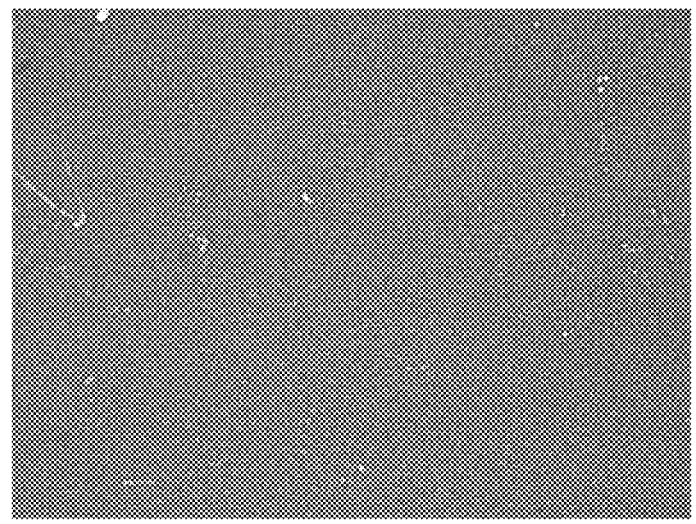
FIG. 17 is a photograph of a surface of the piezoelectric layer in Example 7.
Figure 18:
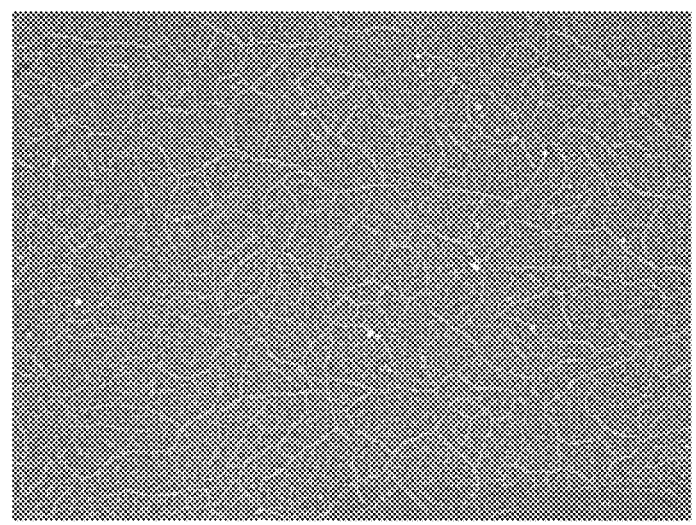
FIG. 18 is a photograph of a surface of the piezoelectric layer in Comparative Example 11.

As shown in FIG. 17, in the piezoelectric layer of Example 7, no cracks were observed. However, in the piezoelectric layer of Comparative Example 11, as shown in FIG. 18, a large number of cracks occurred. Similarly, no cracks were observed in the piezoelectric layers of Examples 1 to 6, whereas many cracks occurred in the piezoelectric layers of Comparative Examples 1 to 10.

These results reveal that no occurrence of cracks in the piezoelectric layer and excellent crystallinity of the piezoelectric layer are achieved by that the crystals of the piezoelectric layer having a perovskite structure are strongly oriented along a specific direction. This is caused by the buffer layer made of an oxide containing Bi and an element selected from Al, Si, Cr, and Mn.

TABLE 1

| | Buffer layer producing conditions | | | | | |
|---|---|---|---|---|---|---|
| | Composition | | Composition ratio | Thickness | Molar concentration | Firing temperature | Measurement result |
| | A | B | A:B | (nm) | of Bi (mol/l) | (° C.) | Orientation |
| Example 1 | Bi | Al | 1:1 | 10 | 0.03125 | 700 | (111) |
| Example 2 | Bi | Al | 1:1 | 20 | 0.06250 | 700 | (111) main orientation (including a small amount of (110) orientation) |
| Example 3 | Bi | Al | 1:1 | 40 | 0.12500 | 700 | |
| Example 4 | Bi | Al | 1:1 | 80 | 0.25000 | 700 | |
| Example 5 | Bi | Si | 1:1 | 10 | 0.03125 | 700 | (110) |
| Example 6 | Bi | Cr | 1:1 | 10 | 0.03125 | 700 | Strong orientation along an appropriate direction |
| Example 7 | Bi | Mn | 1:1 | 10 | 0.03125 | 700 | (100) |
| Comparative Example 1 | Bi | Y | 1:1 | 10 | 0.03125 | 700 | (100), (110), Non-orientation, heterogeneous phase |
| Comparative Example 2 | Bi | Ga | 1:1 | 10 | 0.03125 | 700 | (100), (110), Non-orientation |
| Comparative Example 3 | Bi | Ta | 1:1 | 10 | 0.03125 | 700 | (110), Non-orientation, heterogeneous phase |
| Comparative Example 4 | Bi | Zr | 1:1 | 10 | 0.03125 | 700 | (100), (110), Non-orientation |
| Comparative Example 5 | Bi | Nb | 1:1 | 10 | 0.03125 | 700 | (110), Non-orientation, heterogeneous phase |
| Comparative Example 6 | Bi | Zn | 1:1 | 10 | 0.03125 | 700 | (100), (110), Non-orientation |
| Comparative Example 7 | Bi | Ni | 1:1 | 10 | 0.03125 | 700 | (100), Non-orientation |
| Comparative Example 8 | Bi | Cu | 1:1 | 10 | 0.03125 | 700 | (100), (110), Non-orientation |
| Comparative Example 9 | Bi | V | 1:1 | 10 | 0.03125 | 700 | (100), (110), Non-orientation |
| Comparative Example 10 | Bi | B | 1:1 | 10 | 0.03125 | 700 | (100), (110), Non-orientation |
| Comparative Example 11 | — | — | — | — | — | 700 | (100), (110), Non-orientation |

Test Example 2

Figure 19A:
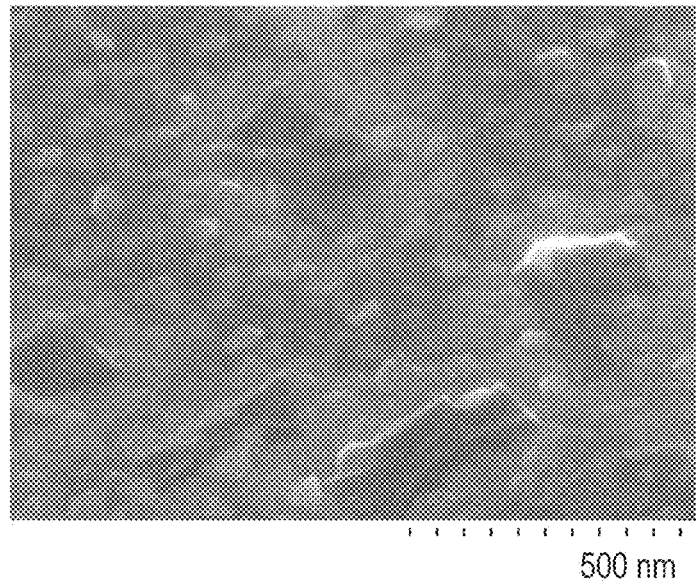
FIG. 19A is an SEM photograph of a surface of the buffer layer in Example 1.
Figure 19B:
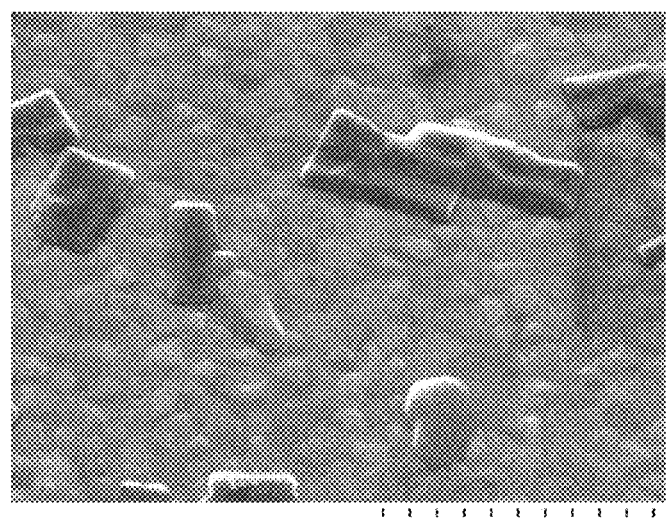
FIG. 19B is an SEM photograph of a surface of the buffer layer in Example 7.

The surfaces of the piezoelectric layers having a thickness of 700 nm in Examples 1 to 7 and Comparative Examples 1 to 11 were each observed with a metallographic microscope The surfaces of the buffer layers 72 in Examples 1 and 7 were observed with a scanning electron microscope at a magnification of 100000 before formation of the complex oxide layers 74, i.e., immediately after the formation of the buffer layers 72. The results are shown in FIGS. 19A and 19B. As shown in FIGS. 19A and 19B, the buffer layers of Examples 1 and 7 were each formed in an island form in such a manner that a plurality of domains is formed so as to be separated from one another. In addition, the first electrode was exposed between the domains.

Test Example 3

The reduction in voltage when the buffer layer was formed in an island form was evaluated through simulation by the following procedure. A voltage of 1 V was applied to piezoelectric elements each including a piezoelectric layer having a buffer layer in an island form, and the voltage applied to the buffer layer was calculated. Table 2 shows parameters used for the calculation.

Figure 20:
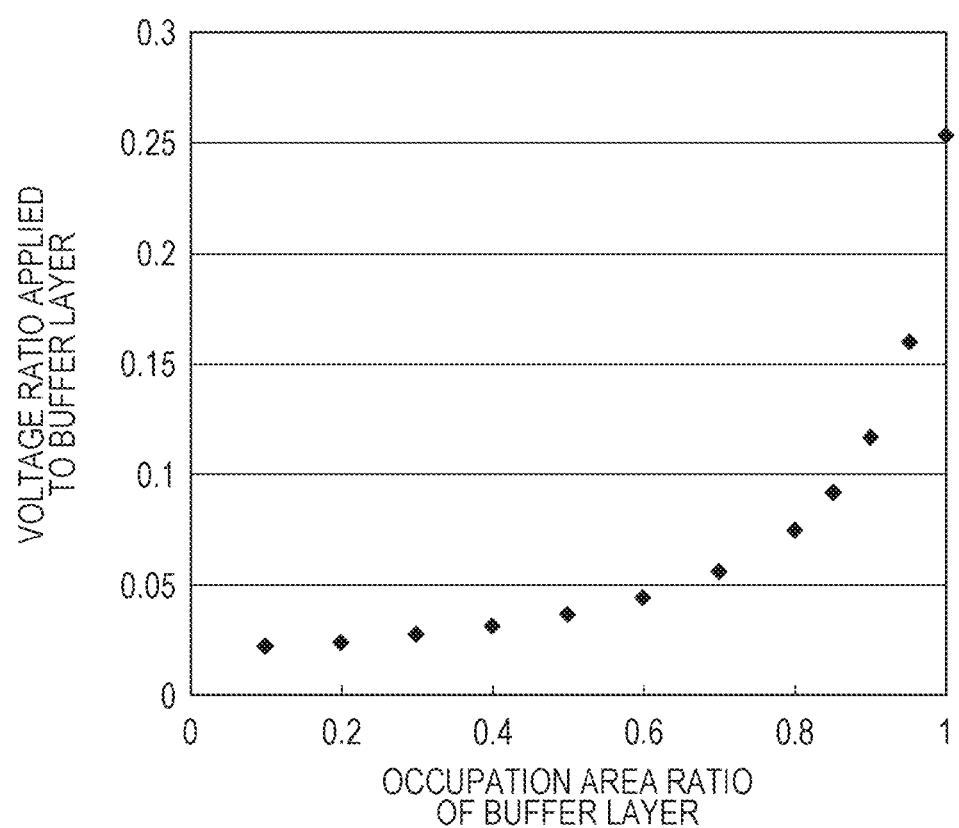
FIG. 20 is a graph showing a relationship between the occupation area ratio of a buffer layer and the voltage ratio applied to the buffer layer.

FIG. 20 shows a relationship between the occupation area ratio of a buffer layer and the voltage ratio applied to the buffer layer. The occupation area ratio of a buffer layer was calculated from the areas of the buffer layer and the complex oxide layer in a planar view from the thickness direction by dividing the occupation area of the buffer layer by the total area of the first electrode.

FIG. 20 demonstrates that the voltage applied to the buffer layer suddenly decreases when the occupation area ratio of the buffer layer reaches about 0.9. This result demonstrates that a smaller occupation area of the buffer layer, e.g., an occupation area ratio of 0.2 or less, can prevent concentration of a voltage in the buffer layer having a low dielectric constant and can reduce a decrease in voltage due to the presence of the buffer layer.

The results of test examples 1 to 3 above demonstrate that a piezoelectric layer having less occurrence of cracks, having excellent crystalline orientation, and receiving reduced adverse influence by a decrease in voltage due to the presence of a buffer layer can be prepared. The resulting piezoelectric layer is a film that can sufficiently show the piezoelectric properties. Accordingly, the invention can provide a liquid ejecting head, liquid ejecting apparatus, and piezoelectric element having excellent piezoelectric properties and high reliability.

TABLE 2

| | Relative dielectric constant | Thickness (nm) |
|---|---|---|
| Piezoelectric material (complex oxide layer) | 500 | 980 |
| Buffer layer | 30 | 20 |
| Piezoelectric layer | — | 1000 |

Other Embodiments

An embodiment of the invention has been described above, but the basic configuration of the invention is not limited to the above. For example, a single-crystal silicon substrate was exemplified as the passage-forming substrate 10 in the above-described embodiment, but the passage-forming substrate is not limited thereto and may be, for example, an SOI substrate or may be made of a substrate such as glass.

In the above-described embodiment, a piezoelectric element 300 including a first electrode 60, a piezoelectric layer 70, and a second electrode 80 laminated in this order on a substrate (passage-forming substrate 10) has been exemplified, but the invention is not limited thereto. For example, the invention can be applied to a longitudinal vibration-type piezoelectric element that extends and contracts in the axial direction by alternately laminating a piezoelectric material and an electrode-forming material.

Figure 21:
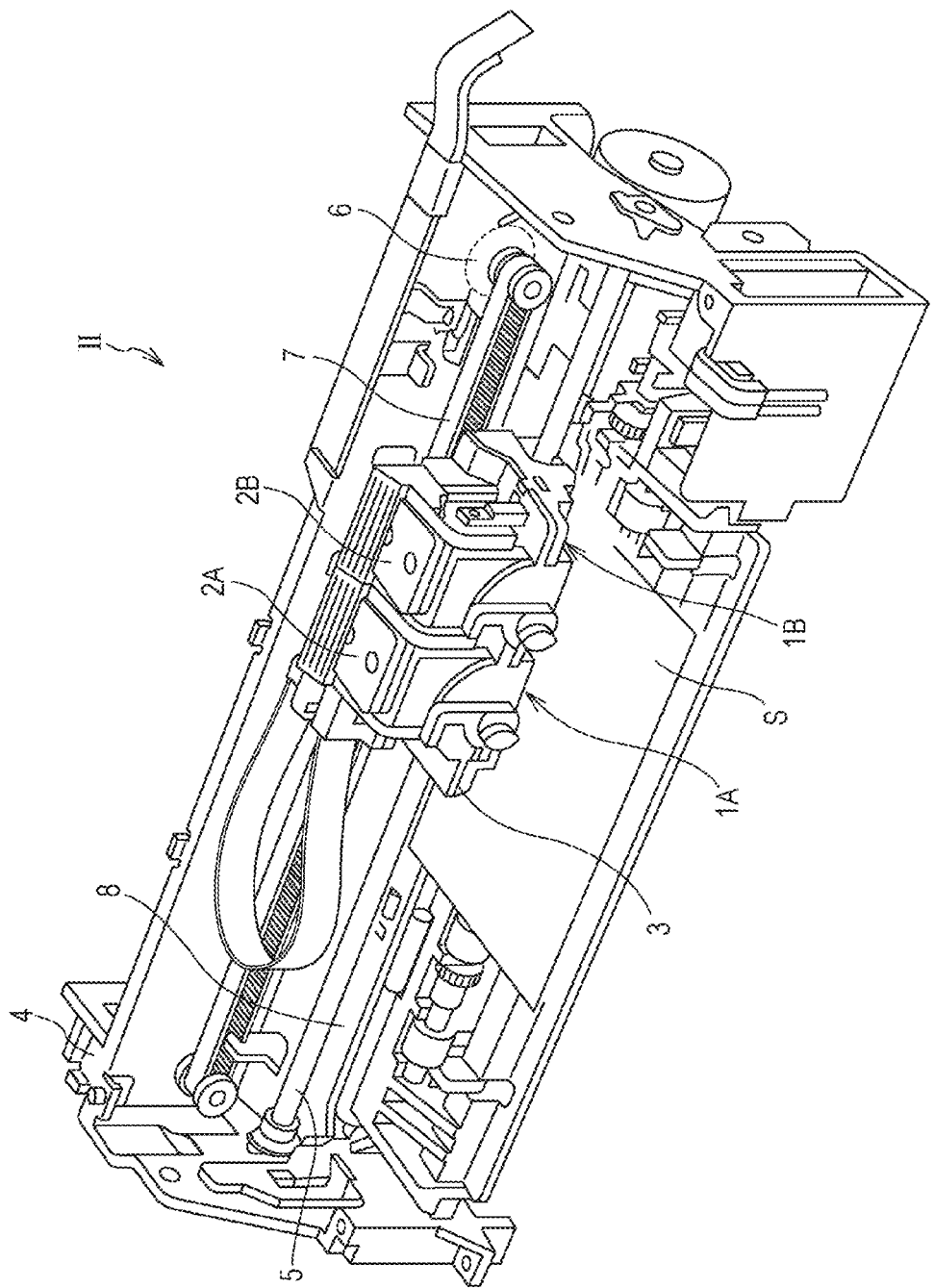
FIG. 21 is a diagram schematically illustrating a structure of a recording apparatus according to an embodiment of the invention.

The ink jet recording heads of these embodiments each partially constitute a recording head unit including an ink flow path communicating with, for example, an ink cartridge and are each mounted on an ink jet recording apparatus. FIG. 21 is a schematic diagram illustrating an example of the ink jet recording apparatus.

In the ink jet recording apparatus II shown in FIG. 21, recording head units 1A and 1B including the ink jet recording heads I are detachably provided with ink cartridges 2A and 2B constituting ink supplying means. A carriage 3 on which the recording head units 1A and 1B are mounted is set to a carriage shaft 5, which is fixed to an apparatus body 4, in such a manner that the carriage 3 is movable in the axial direction. The recording head units 1A and 1B discharge, for example, a black ink composition and a color ink composition, respectively.

Driving force of a driving motor 6 is transferred to the carriage 3 through a plurality of gears (not shown) and a timing belt 7, and thereby the carriage 3, on which the recording head units 1A and 1B are mounted, moves along the carriage shaft 5. The apparatus body 4 is provided with a platen 8 along the carriage shaft 5, and a recording sheet S, a recording medium such as paper, is fed by, for example, a feeding roller (not shown) and is wrapped around the platen 8 and thereby transported.

In the above-described embodiment, an ink jet recording head has been described as an example of the liquid ejecting head according to the invention. The invention can be widely applied to liquid ejecting heads in general and can be applied to liquid ejecting heads that eject liquid other than ink. Examples of the liquid ejecting head include a variety of recording heads of image recording apparatuses such as printers, coloring material ejecting heads used for producing color filters of, for example, liquid crystal displays, electrode material ejecting heads used for forming electrodes of, for example, organic EL displays or field emission displays (FEDs), and bio-organic material ejecting heads used for producing bio-chips.

The piezoelectric element according to the invention can be applied not only to the piezoelectric elements including liquid ejecting heads but also to other devices. Examples of such devices include ultrasonic devices such as ultrasonic oscillators, ultrasonic motors, heat-to-electricity converters, pressure-to-electricity converters, ferroelectric transistors, piezoelectric transformers, shielding filters for harmful rays such as infrared rays, optical filters utilizing a photonic crystal effect due to quantum dot formation, and filters such as optical filters utilizing light interference in thin films. The invention can also be applied to piezoelectric elements used as sensors or piezoelectric elements used as ferroelectric memories. Examples of the sensor including the piezoelectric element include infrared sensors, ultrasonic sensors, thermal sensors, pressure sensors, pyroelectric sensors, and gyrosensors (angular velocity sensors).

The entire disclosure of Japanese Patent Application No. 2013-065183, filed Mar. 26, 2013 is incorporated by reference herein.

What is claimed is:

1. A piezoelectric element comprising:
a first electrode;
a second electrode; and
a piezoelectric layer between the first and the second electrodes, the piezoelectric layer including:
a buffer layer disposed on the first electrode and containing bismuth and aluminum; and a complex oxide layer disposed on the buffer layer and having a perovskite structure containing bismuth, iron, barium, and titanium, wherein the piezoelectric layer includes crystals preferentially oriented along a (111) plane.

2. The piezoelectric element according to claim 1, wherein the buffer layer has a thickness of 10 nm or less.

3. The piezoelectric element according to claim 1, wherein the buffer layer is disposed in an island form.

4. The piezoelectric element according to claim 1, wherein the complex oxide layer further contains manganese.

5. A piezoelectric element comprising:
a first electrode;
a second electrode; and
a piezoelectric layer between the first and the second electrodes, the piezoelectric layer including:
a buffer layer disposed on the first electrode and containing bismuth and silicon; and
a complex oxide layer disposed on the buffer layer and having a perovskite structure containing bismuth, iron, barium, and titanium, wherein the piezoelectric layer includes crystals preferentially oriented along a (110) plane.

6. The piezoelectric element according to claim 5, wherein the buffer layer has a thickness of 10 nm or less.

7. The piezoelectric element according to claim 5, wherein the buffer layer is disposed in an island form.

8. The piezoelectric element according to claim 5, wherein the complex oxide layer further contains manganese.

9. A piezoelectric element comprising:
a first electrode;
a second electrode; and
a piezoelectric layer between the first and the second electrodes, the piezoelectric layer including:
a buffer layer disposed on the first electrode and containing bismuth and chromium; and
a complex oxide layer disposed on the buffer layer and having a perovskite structure containing bismuth, iron, barium, and titanium, wherein the piezoelectric layer includes crystals strongly oriented along an appropriate direction.

10. The piezoelectric element according to claim 9, wherein the buffer layer has a thickness of 10 nm or less.

11. The piezoelectric element according to claim 9, wherein the buffer layer is disposed in an island form.

12. The piezoelectric element according to claim 9, wherein the complex oxide layer further contains manganese.

* * * * *